(12) United States Patent
Hekmatshoar-Tabari et al.

(10) Patent No.: US 9,093,548 B2
(45) Date of Patent: Jul. 28, 2015

(54) THIN FILM HYBRID JUNCTION FIELD EFFECT TRANSISTOR

(71) Applicant: International Business Machines Corporation, Armonk, NY (US)

(72) Inventors: Bahman Hekmatshoar-Tabari, Mount Kisco, NY (US); Devendra K. Sadana, Pleasantville, NY (US); Ghavam G. Shahidi, Round Ridge, NY (US); Davood Shahrjerdi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/839,213

(22) Filed: Mar. 15, 2013

(65) Prior Publication Data

US 2013/0328110 A1    Dec. 12, 2013

Related U.S. Application Data

(60) Provisional application No. 61/656,090, filed on Jun. 6, 2012.

(51) Int. Cl.
*H01L 29/808* (2006.01)
*H01L 29/66* (2006.01)
*H01L 29/80* (2006.01)
(Continued)

(52) U.S. Cl.
CPC ........ *H01L 29/808* (2013.01); *H01L 29/66431* (2013.01); *H01L 29/66848* (2013.01); *H01L 29/66901* (2013.01); *H01L 29/802* (2013.01); *H01L 29/872* (2013.01); *H01L 29/165* (2013.01)

(58) Field of Classification Search
CPC .................................................. H01I 27/14679
USPC .......... 257/256, 504, 314, E27.148, E29.265, 257/E29.314, E21.403, E21.407, E21.421
See application file for complete search history.

(56) References Cited

U.S. PATENT DOCUMENTS 5,196,907 A * 3/1993 Birkle et al. .................. 257/289
5,559,344 A    9/1996 Kawachi (Continued)

FOREIGN PATENT DOCUMENTS

WO    WO 2006040735 A1    4/2006
WO    WO 2007088494 A1    8/2007
WO    WO 2008017714 A1    2/2008

OTHER PUBLICATIONS

Kanicki, et al., "Investigation of the Silicon Nitride on Hydrogenated Amorphous Silicon Interface", Mat. Res. Soc. Symp. Proc., 1989, vol. 149, pp. 729-734.*

(Continued)

*Primary Examiner* — Roy Potter
*Assistant Examiner* — Damian A Hillman
(74) *Attorney, Agent, or Firm* — Scully, Scott, Murphy & Presser, P.C.; Louis J. Percello, Esq.

(57) ABSTRACT

Junction field effect transistors are provided which include a gate junction located on a surface of a crystalline semiconductor material of a first conductivity type. The gate junction can be selected from one of a doped hydrogenated crystalline semiconductor material layer portion of a second conductivity type which is opposite the first conductivity type, a doped hydrogenated non-crystalline semiconductor material layer portion of a second conductivity type which is opposite the first conductivity type, and a Schottky contact.

18 Claims, 7 Drawing Sheets

(51) Int. Cl.
*H01L 29/872* (2006.01)
*H01L 29/165* (2006.01)

(56) References Cited

U.S. PATENT DOCUMENTS

| | | | |
|---|---|---|---|
| 5,686,734 | A | 11/1997 | Hamakawa et al. |
| 6,534,790 | B2 * | 3/2003 | Kuzuhara et al. ............... 257/76 |
| 7,579,287 | B2 | 8/2009 | Ishihara et al. |
| 8,084,786 | B2 | 12/2011 | John et al. |
| 8,779,597 | B2 | 7/2014 | Lee |
| 2002/0011622 | A1 | 1/2002 | Keshavarzi et al. |
| 2003/0207524 | A1 * | 11/2003 | Zhang et al. ................... 438/200 |
| 2004/0256633 | A1 | 12/2004 | Thornton |
| 2010/0314664 | A1 | 12/2010 | John et al. |
| 2011/0003456 | A1 | 1/2011 | Mazzola |
| 2012/0049282 | A1 | 3/2012 | Chen et al. |
| 2012/0118383 | A1 * | 5/2012 | Bedell et al. ................... 136/261 |
| 2012/0210932 | A1 | 8/2012 | Hekmatshoartabari et al. |
| 2012/0228611 | A1 | 9/2012 | Chan et al. |
| 2013/0313552 | A1 | 11/2013 | Hekmatshoar-Tabari et al. |

OTHER PUBLICATIONS

Hekmatshoar, et al. (herein with Hekmatshoar), "Novel Heterojunction Solar Cells with Conversion Efficiencies Approaching 21% on p-Type Crystalline Silicon Substrates", IEEE, 2011, 978-1-4577-0505-2/11, pp. 36.6.1-36.6.4.*

U.S. Office Action dated Aug. 1, 2014 received in U.S. Appl. No. 13/389,100.

U.S. Office Action dated Aug. 21, 2014 received in U.S. Appl. No. 13/838,695.

Gelatos, A.V. and Kanicki, J., "Investigation of the Silicon Nitride on Hydrogenated Amorphous Silicon Interface", Mat. Res. Soc. Symp. Proc., 1989, vol., 149., pp. 729-734.

Campmany, J.L., et al., "Plasma-deposited silicon nitride films with low hydrogen content for amorphous silicon thin-film transistors application", Sensors and Actuators A, 1993, v.77-38, pp. 333-336.

U.S. Appl. No. 13/481,048 Entitled, "Bipolar Junction Transistor With Epitaxial Contacts", filed May 25, 2012, First Named Inventor: Bahman Hekmatshoartabari.

Notice of Allowance dated Oct. 15, 2014 received in U.S. Appl. No. 13/839,161.

Office Action dated Dec. 8, 2014 received in U.S. Appl. No. 13/839,100.

U.S. Office Action dated Jan. 23, 2015 received in U.S. Appl. No. 13/838,695.

Sakamoto, Y., et al., "Perfluoropentacene: High-performance p-n junctions and complementary circuits with pentacene", Journal of the American Chemical Society, (Jul. 7, 2004), vol. 126, No. 26, pp. 8138-8140.

Klauk, H., et al., "Flexible organic complementary ciruits", Electron Devices, IEEE Transactions on Electron Devices, (Apr. 2005), vol. 52, No. 4, pp. 618-622.

Hekmatshoar, B., et al., "Heterojunction bipolar transistors with hydrogenated amorphous silicon contacts on crystalline silicon", Electronic Letters, (Aug. 30, 2012), vol. 48, No. 18, pp. 1161-1163.

Office Action dated May 19, 2015 received in U.S. Appl. No. 13/838,695.

Tucci, M., "Optimization of n-doping in n-type a-Sl:H/p-type textured c-Si heterojunction for photovoltaic applications", Solar Energy Materials & Solar Cells, 1999, 57, pp. 249-257.

Saboundji, A., et al., "Thin film transistors on large single crystalline regions of silicon induced by cw laser crystallization", Journal of Non-Crystalline Solids, 2004, pp. 758-761.

Kuo, Y., et al., "Fabrication and Characterization of Hydrogenated Amorphous Silicon Bipolar Thin Film Transistor (B-TFT)", Mat. Res. Soc. Symp. Proc., 2004, vol. 88, pp. A4.7.1-A4.7.6.

* cited by examiner

THIN FILM HYBRID JUNCTION FIELD EFFECT TRANSISTOR

RELATED APPLICATION

The present application claims benefit of U.S. Provisional Application Ser. No. 61/656,090, filed Jun. 6, 2012, the entire content of which is incorporated herein by reference.

BACKGROUND

The present disclosure relates to semiconductor structures and methods of fabricating the same. More particularly, the present disclosure relates to junction field effect transistors (JFETs) that are processed on thin single crystalline semiconductor substrates using mainstream large area deposition techniques.

Low-cost large-area processing is highly desirable for applications in large-area electronics such as the fabrication of thin-film transistor (TFT) backplanes for active-matrix displays. However, large-area deposition techniques are typically suited for growing non-crystalline or poly-crystalline materials resulting in a device performance which is inferior to that of single-crystalline materials. Processing single-crystalline devices typically requires a CMOS foundry which is too expensive for large area electronics and displays.

SUMMARY

Junction field effect transistors are provided which include a gate junction located on a surface of a crystalline semiconductor material of a first conductivity type. The gate junction can be selected from one of a doped hydrogenated crystalline semiconductor material layer portion of a second conductivity type which is opposite the first conductivity type, a doped hydrogenated non-crystalline semiconductor material layer portion of a second conductivity type which is opposite the first conductivity type, and a Schottky contact.

In one aspect of the present disclosure, junction field effect transistors are provided which include a gate junction located on a surface of a crystalline semiconductor material. In one embodiment of the present disclosure, the junction field effect transistor includes a crystalline semiconductor material of a first conductivity type located on a surface of an insulating substrate. A gate junction is located on a surface of the crystalline semiconductor material. In accordance with this embodiment of the present disclosure, the gate junction comprises a doped hydrogenated crystalline semiconductor material layer portion of a second conductivity type, wherein the second conductivity type is opposite from the first conductivity type and wherein the doped hydrogenated crystalline semiconductor material layer portion has a hydrogen concentration from 5 atomic % to 40 atomic %.

In another embodiment of the present disclosure, the junction field effect transistor includes a crystalline semiconductor material of a first conductivity type located on a surface of an insulating substrate. A gate junction is located on a surface of the crystalline semiconductor material. In accordance with this embodiment of the present disclosure, the gate junction comprises a doped hydrogenated non-crystalline semiconductor material layer portion of a second conductivity type, wherein the second conductivity type is opposite from the first conductivity type.

In yet another embodiment of the present disclosure, the junction field effect transistor includes a crystalline semiconductor material of a first conductivity type located on a surface of an insulating substrate. A gate junction is located on a surface of the crystalline semiconductor material. In this particular embodiment, the gate junction comprises a Schottky contact selected from one of a metal layer portion, a metal semiconductor alloy layer portion, and a doped metal semiconductor alloy portion of a second conductivity type, wherein the second conductivity type is opposite from the first conductivity type.

In yet another aspect of the present disclosure, methods are provided for forming the various junction field effect transistors mentioned above. In one embodiment of the present disclosure, the method includes forming a blanket layer of passivation material on a surface of a crystalline semiconductor material of a first conductivity type, wherein the crystalline semiconductor material of the first conductivity type is present on a surface of an insulating substrate. Next, at least one opening is provided into the blanket layer of passivation material which exposes at least one portion of the surface of the crystalline semiconductor material. A doped hydrogenated crystalline semiconductor material layer portion of a second conductivity type is then formed on the exposed at least one portion of the surface of the crystalline semiconductor material. In accordance with this embodiment, the second conductivity type of the doped hydrogenated crystalline semiconductor material layer portion is opposite from the first conductivity type of the crystalline semiconductor material and the doped hydrogenated crystalline semiconductor material layer portion has a hydrogen concentration from 5 atomic % to 40 atomic %.

In another embodiment of the present disclosure, the method includes forming a blanket layer of passivation material on a surface of a crystalline semiconductor material of a first conductivity type, wherein the crystalline semiconductor material of the first conductivity type is present on a surface of an insulating substrate. Next, at least one opening is provided into the blanket layer of passivation material which exposes at least one portion of the surface of the crystalline semiconductor material. At least a doped hydrogenated non-crystalline semiconductor material layer portion of a second conductivity type is then formed atop the exposed at least one portion of the surface of the crystalline semiconductor material. In accordance with this embodiment, the second conductivity type of the doped hydrogenated non-crystalline semiconductor material layer portion is opposite from the first conductivity type of the crystalline semiconductor material.

In another embodiment of the present disclosure, the method includes forming a blanket layer of a passivation material on a surface of a crystalline semiconductor material of a first conductivity type, wherein the crystalline semiconductor material of the first conductivity type is present on a surface of an insulating substrate. Next, at least one opening is provided into the blanket layer of passivation material which exposes at least one portion of the surface of the crystalline semiconductor material. A Schottky contact is then formed atop the exposed at least one portion of the surface of the crystalline semiconductor material. In accordance with this embodiment, the Schottky contact is selected from one of metal layer portion, a metal semiconductor alloy layer portion, and a doped metal semiconductor alloy portion of a second conductivity type, wherein the second conductivity type is opposite from the first conductivity type.

DETAILED DESCRIPTION

Figure 1A:
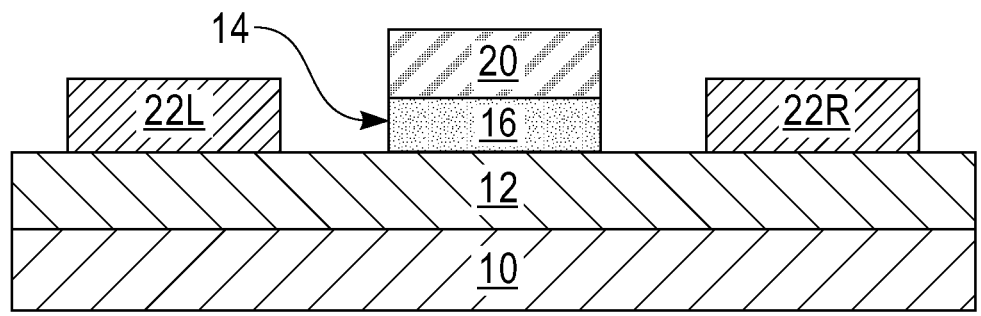
FIGS. 1A-1B are pictorial representations (through cross sectional views) each illustrating an exemplary junction field effect transistor within a first embodiment of the present disclosure.

The present disclosure, which provides junction field transistors (JFETs) that are processed on thin single crystalline semiconductor substrates using mainstream large area deposition techniques, will now be described in greater detail by referring to the discussion and drawings that accompany the present application. It is noted that the drawings of the present application are provided for illustrative purposes and, as such, the drawings are not drawn to scale. In the drawings and description that follows, like and corresponding elements are described and referred to by like reference numerals.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced without these specific details. In other instances, well-known structures or processing steps have not been described in detail in order to avoid obscuring the present disclosure.

As stated above, junction field effect transistors are provided which include a gate junction located on a surface of a crystalline semiconductor material of a first conductivity type. The gate junction can be selected from one of a doped hydrogenated crystalline semiconductor material layer portion of a second conductivity type which is opposite the first conductivity type, a doped hydrogenated non-crystalline semiconductor material layer portion of a second conductivity type which is opposite the first conductivity type, and a Schottky contact. The various junction field effect transistors of the present disclosure are now described in greater detail by referring to FIGS. 1A, 1B, 2A, 2B, 2C, and 3.

Figure 1B:
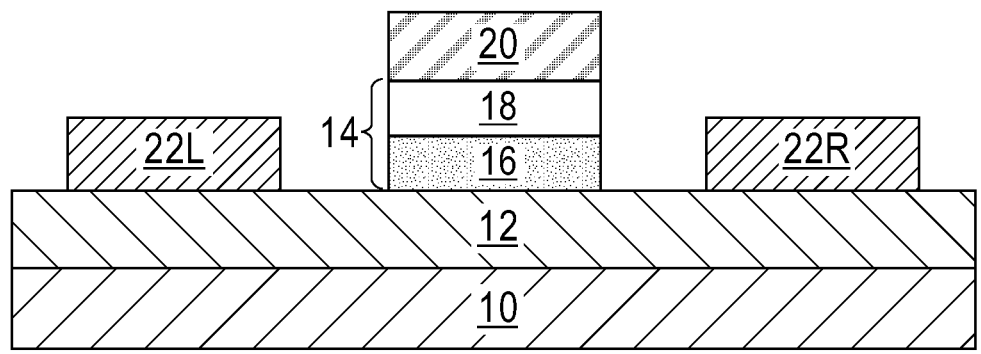

Referring first to FIGS. 1A-1B, there are shown exemplary junction field effect transistors within a first embodiment of the present disclosure. In the first embodiment, the gate junction includes a doped hydrogenated crystalline semiconductor material layer portion of a second conductivity type which is opposite the first conductivity type of the underlying crystalline semiconductor material. Specifically, each of the exemplary junction field effect transistors shown in FIGS. 1A-1B includes a crystalline semiconductor material 12 of a first conductivity type located on a surface of an insulating substrate 10.

The insulating substrate 10 that can be employed in the present disclosure includes, but is not limited to, an oxide, a nitride, an oxynitride or a multilayered stack. In one embodiment, the insulating substrate 10 is comprised of a semiconductor oxide and/or a semiconductor nitride. An example of a semiconductor oxide that can be employed as the insulating substrate 10 includes silicon dioxide, while an example of a semiconductor nitride is silicon nitride. The thickness of the insulating substrate 10 can be from 5 nm to 500 nm. Other thicknesses that are lesser than, or greater than, the aforementioned thickness range can also be employed as the thickness of the insulating substrate 10. In some embodiments, a handle substrate (not shown in the drawings) such as, for example, a semiconductor substrate, glass, plastic or metal foil can be located directly beneath the insulating substrate 10. In embodiments where the handle substrate is insulating, a separate insulating material is not needed since the insulating handle substrate can serve as the insulating substrate 10.

In one embodiment, the insulating substrate 10 is a component of a semiconductor-on-insulator substrate. In this embodiment, the crystalline semiconductor material 12 of the first conductivity type can be the topmost semiconductor layer of the semiconductor-on-insulator substrate. In another embodiment, the insulating substrate 10 is formed on a surface of a handle substrate by deposition or a thermal growth technique and then an exposed surface of the insulating substrate 10 is bonded to a crystalline semiconductor layer (doped or non-doped) which can be used as the crystalline semiconductor material 12 of the first conductivity type.

The term "crystalline" is used throughout the present disclosure to denote a single crystalline material, a multi-crystalline material or a polycrystalline material. Typically, the crystalline semiconductor material that is employed in the present disclosure is comprised of a single crystalline semiconductor material. The term "non-crystalline" is used throughout the present disclosure to denote an amorphous, nano-crystalline or micro-crystalline material.

In one embodiment, the crystalline semiconductor material 12 of the first conductivity type that can be employed in the present disclosure can be an III-V compound semiconductor which includes at least one element from Group IIIA (i.e., Group 13) of the Periodic Table of Elements and at least one element from Group VA (i.e., Group 15) of the Periodic Table of Elements. The range of possible formulae for suitable III-V compound semiconductors that can be used in the present disclosure is quite broad because these elements can form binary (two elements, e.g., gallium (III) arsenide (GaAs)), ternary (three elements, e.g., indium gallium arsenide (InGaAs)) and quaternary (four elements, e.g., aluminum gallium indium phosphide (AlInGaP)) alloys.

In another embodiment of the present disclosure, the crystalline semiconductor material 12 of the first conductivity type can be a semiconductor material having the formula $Si_yGe_{1-y}$ wherein y is $0 \leq y \leq 1$. In some embodiments, in which y is 1, the crystalline semiconductor material 12 of the first conductivity type can be comprised entirely of Si. In another embodiment, in which y is 0, the crystalline semiconductor material 12 of the first conductivity type can be comprised entirely of Ge. In yet another embodiment and when y is other than 0 or 1, the crystalline semiconductor material 12 of the first conductivity type can be comprised entirely of a SiGe alloy.

In yet another embodiment of the present disclosure, the crystalline semiconductor material 12 of the first conductivity type can be a semiconductor material comprised of SiC.

In some embodiments of the present disclosure, the crystalline semiconductor material 12 may include nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

The first conductivity type of the crystalline semiconductor material 12 of the present disclosure can be either p-type or n-type. As used herein, "p-type" refers to the addition of impurities to an intrinsic semiconductor that creates deficiencies of valence electrons (i.e., holes). In a Si-containing semiconductor material, examples of p-type dopants, i.e., impurities, include but are not limited to, boron, aluminum, gallium and indium. In one embodiment, in which the first conductivity type of the crystalline semiconductor material 12 of the present disclosure is p-type, the p-type dopant is present in a concentration ranging from $1\times10^9$ atoms/cm$^3$ to $1\times10^{20}$ atoms/cm$^3$. In another embodiment, in which the first conductivity type of the crystalline semiconductor material 12 of the present disclosure is p-type, the p-type dopant is present in a concentration ranging from $1\times10^{14}$ atoms/cm$^3$ to $1\times10^{19}$ atoms/cm$^3$. As used herein, "n-type" refers to the addition of impurities that contributes free electrons to an intrinsic semiconductor. In a Si-containing semiconductor, examples of n-type dopants, i.e., impurities, include but are not limited to, antimony, arsenic and phosphorous. In one embodiment, in which the first conductivity type of the crystalline semiconductor material 12 of the present disclosure is n-type, the n-type dopant is present in a concentration ranging from $1\times10^9$ atoms/cm$^3$ to $1\times10^{20}$ atoms/cm$^3$. In another embodiment, in which the first conductivity type of the crystalline semiconductor material 12 of the present disclosure is n-type, the n-type dopant is present in a concentration ranging from $1\times10^{14}$ atoms/cm$^3$ to $1\times10^{19}$ atoms/cm$^3$.

The dopant concentration that provides the first conductivity type within the crystalline semiconductor material 12 of the present disclosure may be graded or uniform. By "uniform" it is meant that the dopant concentration is the same throughout the entire thickness of the crystalline semiconductor material 12. For example, a crystalline semiconductor material 12 of the first conductivity type having a uniform dopant concentration may have the same dopant concentration at the upper surface and bottom surface of the semiconductor material, as well as the same dopant concentration at a central portion of the semiconductor material between the upper surface and the bottom surface of the crystalline semiconductor material 12 of the first conductivity type. By "graded" it is meant that the dopant concentration varies throughout the thickness of the crystalline semiconductor material 12 of the first conductivity type. For example, a crystalline semiconductor material 12 of the first conductivity type having a graded dopant concentration may have an upper surface with a greater dopant concentration than the bottom surface of the a crystalline semiconductor material 12 of the first conductivity type, and vice versa.

The first conductivity type can be introduced during the growth of the crystalline semiconductor material that can be used as element 12 of the present disclosure. Alternatively, the first conductivity type can be introduced into an intrinsic crystalline semiconductor material by utilizing ion implantation, and/or gas phase doping and the doped crystalline semiconductor material can be employed as the crystalline semiconductor material 12 of the first conductivity type.

The thickness of the crystalline semiconductor material 12 of the first conductivity type can be from 3 nm to 3 μm. Other thicknesses that are lesser than, or greater than, the aforementioned thickness range can also be employed for the thickness of the crystalline semiconductor material 12 of the first conductivity type.

Each of the exemplary junction field effect transistors shown in FIGS. 1A-1B also includes a gate junction 14 that is located on a surface of the crystalline semiconductor material 12 of the first conductivity type. In accordance with the embodiment of the present disclosure shown in FIG. 1A, the gate junction 14 comprises a doped hydrogenated crystalline semiconductor material layer portion 16 of a second conductivity type. In accordance with the embodiment of the present disclosure shown in FIG. 1B, the gate junction 14 comprises a doped hydrogenated crystalline semiconductor material layer portion 16 of a second conductivity type and a doped hydrogenated non-crystalline semiconductor material layer portion 18 also of the second conductivity type located on a surface of the doped hydrogenated crystalline semiconductor material layer portion 16 of the second conductivity type. The second conductivity type dopant within the semiconductor material layer portions 16 and 18 can be independently of each other, uniformly present or present as a gradient.

In either embodiment, the second conductivity type of the various semiconductor material layer portions (16 and 18) is different from the first conductivity type of the crystalline semiconductor material 12 of the first conductivity type. In one embodiment of the present disclosure and when the crystalline semiconductor material 12 of the first conductivity type comprises a p-type dopant, then both the doped hydrogenated crystalline semiconductor material layer portion 16 and the doped hydrogenated non-crystalline semiconductor material layer portion 18 include an n-type dopant. In another embodiment of the present disclosure and when the crystalline semiconductor material 12 of the first conductivity type comprises an n-type dopant, then both the doped hydrogenated crystalline semiconductor material layer portion 16 and the doped hydrogenated non-crystalline semiconductor material layer portion 18 include a p-type dopant.

Also, in either embodiment, the bottommost layer of the doped hydrogenated crystalline semiconductor material layer portion 16 of the gate junction 14 is in direct contact with a portion of the uppermost surface of the crystalline semiconductor material 12.

The doped hydrogenated crystalline semiconductor material layer portion 16 of the gate junction 14 may comprise a same or different semiconductor material as that of the crystalline semiconductor material 12. In one embodiment, the doped hydrogenated crystalline semiconductor material layer portion 16 of the gate junction 14 has a formula $Si_xGe_{1-x}$ wherein x is $0\leq x\leq 1$. As such, the doped hydrogenated crystalline semiconductor material layer portion 16 of the gate junction 14 may comprise Si (when x is 1), Ge (when x is 0), or a SiGe (when x is other than 1, or 0).

In accordance with the present disclosure, the doped hydrogenated crystalline semiconductor material layer portion 16 contains from 5 atomic % to 40 atomic % hydrogen therein. In one embodiment, the doped hydrogenated crystalline semiconductor material layer portion 16 contains from 10 atomic % to 25 atomic % hydrogen therein. In yet another embodiment, the doped hydrogenated crystalline semiconductor material layer portion 16 contains from 20 atomic % to 30 atomic % hydrogen therein.

In some embodiments of the present disclosure, the doped hydrogenated crystalline semiconductor material layer portion 16 can contain C therein. When present, C can be present in a concentration from 0 atomic % to 50 atomic %. In some embodiments, the doped hydrogenated crystalline semiconductor material layer portion 16 can contain from 0 atomic % to 25 atomic % carbon therein. The carbon impurity can be added by way of either a source gas that includes carbon, or by introducing a carbon source gas into the gas mixture that is employed in the present disclosure for forming the doped hydrogenated crystalline semiconductor material layer portion 16.

In some embodiments of the present disclosure, the doped hydrogenated crystalline semiconductor material layer portion 16 may include nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

The dopant that is contained within the doped hydrogenated crystalline semiconductor material layer portion 16 can be a p-type dopant or an n-type dopant. In a Si-containing doped hydrogenated crystalline semiconductor material layer portion 16 examples of p-type dopants, i.e., impurities, include but are not limited to, boron, aluminum, gallium and indium. In one embodiment, in which the doped hydrogenated crystalline semiconductor material layer portion 16 includes a p-type dopant, the p-type dopant is present in a concentration ranging from $10^{16}$ atoms/cm$^3$ to $10^{21}$ atoms/cm$^3$. In another embodiment, in which the doped hydrogenated crystalline semiconductor material layer portion 16 contains p-type dopant, the p-type dopant is present in a concentration ranging from $10^{18}$ atoms/cm$^3$ to $5\times10^{20}$ atoms/cm$^3$. In a Si-containing doped hydrogenated crystalline semiconductor material layer portion 16, examples of n-type dopants, i.e., impurities, include but are not limited to, antimony, arsenic and phosphorous. In one embodiment, in which the doped hydrogenated crystalline semiconductor material layer portion 16 contains an n-type dopant, the n-type dopant is present in a concentration ranging from $10^{16}$ atoms/cm$^3$ to $10^{21}$ atoms/cm$^3$. In another embodiment, in which the doped hydrogenated crystalline semiconductor material layer portion 16 contains an n-type dopant, the n-type dopant is present in a concentration ranging from $10^{18}$ atoms/cm$^3$ to $5\times10^{20}$ atoms/cm$^3$.

The thickness of the doped hydrogenated crystalline semiconductor material layer portion 16 may range from 2 nm to 100 nm. In another embodiment, the thickness of the doped hydrogenated crystalline semiconductor material layer portion 16 ranges from 5 nm to 15 nm. The doped hydrogenated crystalline semiconductor material layer portion 16 of the gate junction 14 has the same (or nearly the same) crystalline characteristics as the crystalline semiconductor material 12. Thus, the doped hydrogenated crystalline semiconductor material layer portion 16 has an epitaxial relationship with the crystalline semiconductor material 12.

The doped hydrogenated non-crystalline semiconductor material layer portion 18 of the gate junction 14 may comprise a same or different semiconductor material as that of the doped hydrogenated crystalline semiconductor material layer portion 16. In one embodiment, the doped hydrogenated non-crystalline semiconductor material layer portion 18 of the gate junction 14 has a formula $Si_zGe_{1-z}$ wherein z is $0 \leq z \leq 1$. As such, the doped hydrogenated non-crystalline semiconductor material layer portion 18 of the gate junction 14 may comprise Si (when z is 1), Ge (when z is 0), or a SiGe (when z is other than 1, or 0).

In accordance with the present disclosure, the doped hydrogenated non-crystalline semiconductor material layer portion 18 contains from 5 atomic % to 40 atomic % hydrogen therein. In one embodiment, the doped hydrogenated non-crystalline semiconductor material layer portion 18 contains from 10 atomic % to 25 atomic % hydrogen therein. In yet another embodiment, the doped hydrogenated non-crystalline semiconductor material layer portion 18 contains from 20 atomic % to 30 atomic % hydrogen therein.

In some embodiments of the present disclosure, the doped hydrogenated non-crystalline semiconductor material layer portion 18 can contain C therein. When present, C can be present in a concentration from 0 atomic % to 50 atomic %. In some embodiments, the doped hydrogenated non-crystalline semiconductor material layer portion 18 can contain from 0 atomic to 25 atomic % carbon therein. The carbon impurity can be added by way of either a source gas that includes carbon, or by introducing a carbon source gas into the gas mixture that is employed in the present disclosure for forming the doped hydrogenated non-crystalline semiconductor material layer portion 18.

In some embodiments of the present disclosure, the doped hydrogenated non-crystalline semiconductor material layer portion 18 may include nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

The dopant that is contained within the doped hydrogenated non-crystalline semiconductor material layer portion 18 can be a p-type dopant or an n-type dopant. In a Si-containing doped hydrogenated non-crystalline semiconductor material layer portion 18 examples of p-type dopants, i.e., impurities, include but are not limited to, boron, aluminum, gallium and indium. In one embodiment, in which the doped hydrogenated non-crystalline semiconductor material layer portion 18 includes a p-type dopant, the p-type dopant is present in a concentration ranging from $10^{16}$ atoms/cm$^3$ to $10^{21}$ atoms/cm$^3$. In another embodiment, in which the doped hydrogenated non-crystalline semiconductor material layer portion 18 contains p-type dopant, the p-type dopant is present in a concentration ranging from $10^{18}$ atoms/cm$^3$ to $5\times10^{20}$ atoms/cm$^3$. In a Si-containing doped hydrogenated non-crystalline semiconductor material layer portion 18, examples of n-type dopants, i.e., impurities, include but are not limited to, antimony, arsenic and phosphorous. In one embodiment, in which the doped hydrogenated non-crystalline semiconductor material layer portion 18 contains an n-type dopant, the n-type dopant is present in a concentration ranging from $10^{16}$ atoms/cm$^3$ to $10^{21}$ atoms/cm$^3$. In another embodiment, in which doped hydrogenated non-crystalline semiconductor material layer portion 18 contains an n-type dopant, the n-type dopant is present in a concentration ranging from $10^{18}$ atoms/cm$^3$ to $5\times10^{20}$ atoms/cm$^3$.

The thickness of the doped hydrogenated non-crystalline semiconductor material layer portion 18 may range from 2 nm to 100 nm. In another embodiment, the thickness of the doped hydrogenated non-crystalline semiconductor material layer portion 18 ranges from 5 nm to 15 nm.

Each junction field effect transistor shown in FIGS. 1A and 1B also includes an electrode material portion 20 located atop the gate junction 14. In one embodiment, and as shown in FIG. 1A, the electrode material portion 20 is located directly on a surface of the doped hydrogenated crystalline semiconductor material layer portion 16. In another embodiment, and as shown in FIG. 1B, the electrode material portion 20 is located directly on a surface of the doped hydrogenated non-crystalline semiconductor material layer portion 18. In either embodiment, the electrode material portion 20 can be comprised of a conductive material including, for example, a doped Si-containing material, a conductive metal, a conductive metal alloy comprising at least two conductive metals, a conductive metal nitride, a transparent conductive oxide and/or a conductive metal silicide. Examples of conductive metals that can be used include, for example, Cu, W, Pt, Al, Pd, Ru, Ni, and Ir. The electrode material portion 20 can have a thickness from 1 nm to 1000 nm. Other thicknesses that are lesser than, or greater than, the aforementioned thickness range can also be employed as the thickness for the electrode material portion 20.

Each junction field effect transistor shown in FIGS. 1A-1B also includes a first source/drain contact 22L located on a first side of the gate junction 14 and having a bottommost surface in contact with the surface of the crystalline semiconductor material 12, and a second source/drain contact 22R located on second side of the gate junction 14 that is opposite to the first side and having a bottommost surface in contact with the surface of the crystalline semiconductor material 12. As shown, the first source/drain contact 22L and the second source/drain contact 22R are disjoined and are not in direct physical contact with the gate junction 14.

In one embodiment of the present disclosure, the first source/drain contact 22L and the second source/drain contact 22R are each comprised of ohmic metal contacts. In such an embodiment, one of the first and second ohmic contacts may include a same or different conductive material as that of the electrode metal portion 20.

In another embodiment, the first source/drain contact 22L and the second source/drain contact 22R are each comprised of a doped hydrogenated crystalline semiconductor material of the first conductivity type. In this embodiment, the doped hydrogenated crystalline semiconductor material of the first conductivity type may comprise a same or different, typically a same, semiconductor material as the doped hydrogenated crystalline semiconductor material layer portion 16. In accordance with this embodiment, the first conductivity type of the doped hydrogenated crystalline semiconductor material that can be used as the first source/drain contact 22L and the second source/drain contact 22R is the same as that of the first conductivity type of the crystalline semiconductor material 12. In one embodiment, the first and second source/drain contacts 20L, 20R comprising the doped hydrogenated crystalline semiconductor material of the first conductivity type have a higher conductivity than the crystalline semiconductor material 12. A higher conductivity can be achieved by a higher active doping concentration. The doped hydrogenated crystalline semiconductor material that can be used as the first source/drain contact 22L and the second source/drain contact 22R can have a hydrogen concentration that is the same or different, typically the same, as that of the doped hydrogenated crystalline semiconductor material layer portion 16. In one embodiment, the doped hydrogenated crystalline semiconductor material that can be used as the first source/drain contact 22L and the second source/drain contact 22R can have a hydrogen concentration from 5 atomic % to 40 atomic %. The concentration of dopant within the doped hydrogenated crystalline semiconductor material that can be used as the first source/drain contact 22L and the second source/drain contact 22R can be in the ranges mentioned above for the doped hydrogenated crystalline semiconductor material layer portion 16.

In yet another embodiment, the first source/drain contact 22L and the second source/drain contact 22R are each comprised of a doped hydrogenated non-crystalline semiconductor material of the first conductivity type. In this embodiment, the doped hydrogenated non-crystalline semiconductor material of the first conductivity type may comprise a same or different, typically a same, semiconductor material as the doped hydrogenated non-crystalline semiconductor material layer portion 18. In accordance with this embodiment, the first conductivity type of the doped hydrogenated non-crystalline semiconductor material that can be used as the first source/drain contact 22L and the second source/drain contact 22R is the same as that of the first conductivity type of the crystalline semiconductor material 12. In one embodiment, the first and second source/drain contacts 20L, 20R comprising the doped hydrogenated non-crystalline semiconductor material of the first conductivity type have a higher conductivity than the crystalline semiconductor material 12. A higher conductivity can be achieved by a higher active doping concentration. The doped hydrogenated non-crystalline semiconductor material that can be used as the first source/drain contact 22L and the second source/drain contact 22R can have a hydrogen concentration that is the same or different, typically the same, from that of the doped hydrogenated non-crystalline semiconductor material layer portion 18. In one embodiment, the doped hydrogenated non-crystalline semiconductor material that can be used as the first source/drain contact 22L and the second source/drain contact 22R can have a hydrogen concentration from 5 atomic % to 40 atomic %. The concentration of dopant within the doped hydrogenated non-crystalline semiconductor material that can be used as the first source/drain contact 22L and the second source/drain contact 22R can be in the ranges mentioned above for the doped hydrogenated non crystalline semiconductor material layer portion 18.

In some embodiments (not shown in FIGS. 1A and 1B), passivation material layer portions can be located on each side of the gate junction 14. In such an embodiment, one of the passivation material layer portions separates the first source/drain contact 22L from the first side of the gate junction 14, and another of passivation material layer portions separates the second source/drain contact 22R from the second side of the gate junction 14. This embodiment including the various materials that can be employed as the passivation material portions will become more apparent when the various methods of the present disclosure are described and illustrated.

Figure 2A:
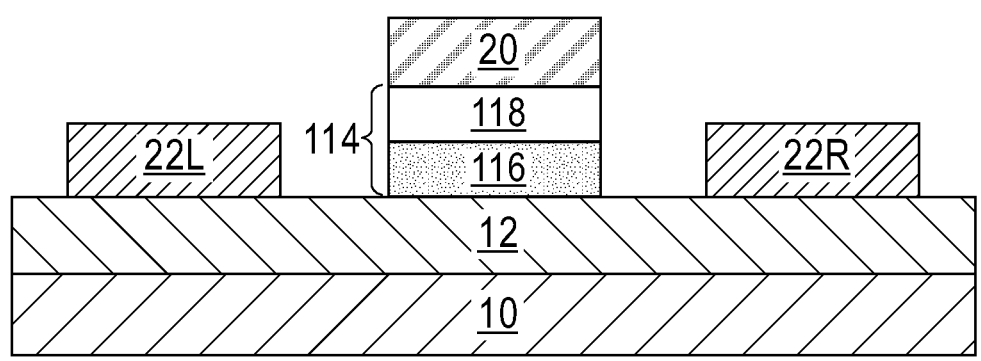
FIGS. 2A-2C are pictorial representations (through cross sectional views) each illustrating an exemplary junction field effect transistor within a second embodiment of the present disclosure.
Figure 2B:
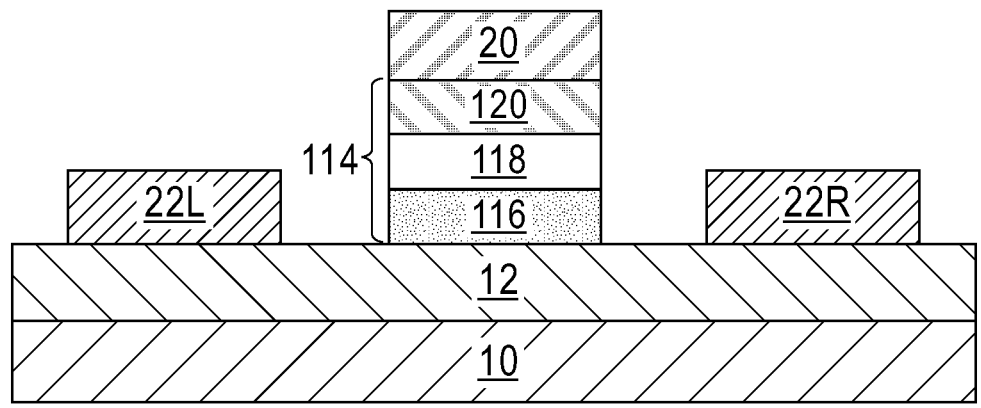
Figure 2C:
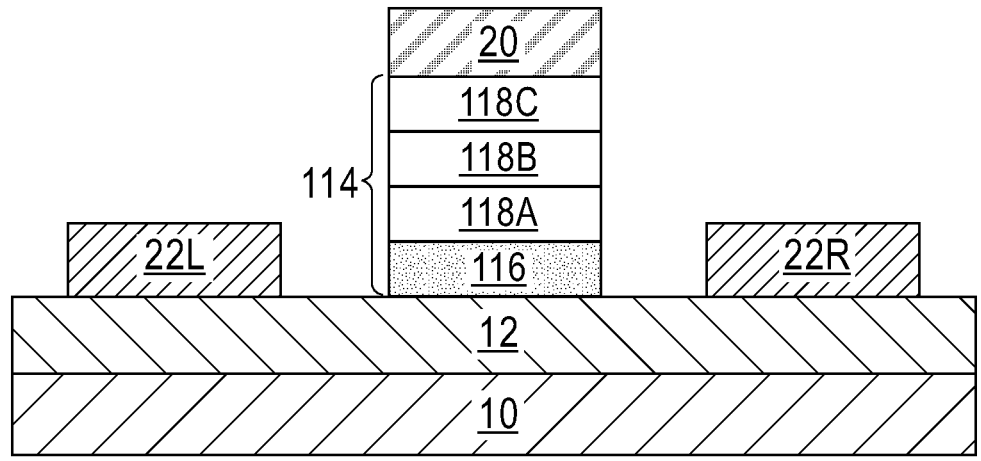

Referring now to FIGS. 2A-2C, there are shown exemplary junction field effect transistors within a second embodiment of the present disclosure. In the second embodiment, the gate junction includes a doped hydrogenated non-crystalline semiconductor material layer portion of a second conductivity type, wherein the second conductivity type is opposite the first conductivity type of an underlying crystalline semiconductor material. In some embodiments, the gate junction includes an optional intrinsic hydrogenated non-crystalline semiconductor material layer portion positioned between the crystalline semiconductor material and the doped hydrogenated non-crystalline semiconductor material layer portion.

In FIGS. 2A, 2B and 2C, the optional intrinsic non-crystalline hydrogenated semiconductor material layer portion is shown to be present. Although such an embodiment is illustrated and described, the present disclosure can also provide structures which are otherwise equivalent to those shown in FIGS. 2A, 2B and 2C except that the optional intrinsic hydrogenated non-crystalline semiconductor material layer portion is not present. In such embodiments, a bottommost surface of the doped hydrogenated non-crystalline semiconductor material layer portion of the second conductivity type directly contacts a portion of the uppermost surface of the crystalline semiconductor material 12. In the particular embodiments illustrated, the optional intrinsic hydrogenated non-crystalline semiconductor material layer portion has a bottommost surface that directly contacts a portion of the uppermost surface of the crystalline semiconductor material 12, and a bottommost surface of the doped hydrogenated non-crystalline semiconductor material layer portion directly contacts a portion of the uppermost surface of the optional intrinsic non-crystalline semiconductor portion.

Specifically, each of the exemplary junction field effect transistors shown in FIGS. 2A, 2B and 2C includes a crystalline semiconductor material 12 of a first conductivity type located on a surface of an insulating substrate 10. The crystalline semiconductor material 12 of the first conductivity type and the insulating substrate 10 employed in the second embodiment of the present disclosure are the same as the crystalline semiconductor material 12 of the first conductivity type and the insulating substrate 10 employed in the first embodiment of the present disclosure. As such, the description of the crystalline semiconductor material 12 of the first conductivity type and the insulating substrate 10 provided in the first embodiment of the present disclosure is incorporated herein by reference.

Each of the exemplary junction field effect transistors shown in FIGS. 2A, 2B and 2C also includes a gate junction 114 that is located on a surface of the crystalline semiconductor material 12 of the first conductivity type. In the illustrated embodiment shown in FIG. 2A, the gate junction 114 includes an optional intrinsic hydrogenated non-crystalline semiconductor material layer portion 116 and a doped hydrogenated non-crystalline semiconductor material layer portion 118 of the second conductivity type. The second conductivity type dopant within semiconductor material layer portion 118 can be uniformly present or present as a gradient.

The term "intrinsic" is used throughout the present disclosure to denote a semiconductor material that contains no doping atoms therein or alternatively a semiconductor material in which the concentration of dopant atoms therein is less than $10^{15}$ atoms/cm$^3$.

The intrinsic hydrogenated non-crystalline semiconductor material layer portion 116 of the gate junction 114 may comprise a same or different semiconductor material as that of the crystalline semiconductor material 12. In one embodiment, the intrinsic hydrogenated non-crystalline semiconductor material layer portion 116 of the gate junction 114 has a formula $Si_pGe_{1-p}$ wherein p is $0 \leq p \leq 1$. As such, the intrinsic hydrogenated non-crystalline semiconductor material layer portion 116 of the gate junction 114 may comprise Si (when p is 1), Ge (when p is 0), or a SiGe (when p is other than 1, or 0).

In accordance with the present disclosure, the intrinsic hydrogenated non-crystalline semiconductor material layer portion 116 contains from 5 atomic % to 40 atomic % hydrogen therein. In one embodiment, the intrinsic hydrogenated non-crystalline semiconductor material layer portion 116 contains from 10 atomic % to 25 atomic % hydrogen therein. In yet another embodiment, the intrinsic hydrogenated non-crystalline semiconductor material layer portion 116 contains from 20 atomic % to 30 atomic % hydrogen therein.

In some embodiments of the present disclosure, the intrinsic hydrogenated non-crystalline semiconductor material layer portion 116 can contain C therein. When present, C can be present in a concentration from 0 atomic % to 50 atomic %. In some embodiments, the intrinsic hydrogenated non-crystalline semiconductor material layer portion 116 can contain from 0 atomic % to 25 atomic % carbon therein. The carbon impurity can be added by way of either a source gas that includes carbon, or by introducing a carbon source gas into the gas mixture that is employed in the present disclosure for forming the intrinsic hydrogenated non-crystalline semiconductor material layer portion 116.

The thickness of the intrinsic hydrogenated non-crystalline semiconductor material layer portion 116 may range from 2 nm to 100 nm. In another embodiment, the thickness of the intrinsic hydrogenated non-crystalline semiconductor material layer portion 116 ranges from 5 nm to 15 nm. The intrinsic hydrogenated non-crystalline semiconductor material layer portion 116 has the same (or nearly the same) crystalline characteristics as the crystalline semiconductor material 12. Thus, the intrinsic hydrogenated non-crystalline semiconductor material layer portion 116 has an epitaxial relationship with the crystalline semiconductor material 12.

The doped hydrogenated non-crystalline semiconductor material layer portion 118 of the second conductivity type of the gate junction 114 may comprise a same or different semiconductor material as that of the intrinsic hydrogenated non-crystalline semiconductor material layer portion 116 or that of the single crystalline semiconductor material 12. In one embodiment, the doped hydrogenated non-crystalline semiconductor material layer portion 118 of the gate junction 114 has a formula $Si_gGe_{1-q}$ wherein q is $0 \leq q \leq 1$. As such, the doped hydrogenated non-crystalline semiconductor material layer portion 118 of the gate junction 114 may comprise Si (when q is 1), Ge (when q is 0), or a SiGe (when q is other than 1, or 0).

In some embodiments of the present disclosure, the doped hydrogenated non-crystalline semiconductor material layer portion 118 may include nitrogen, oxygen, fluorine, deuterium, chlorine or any combination thereof. When present, the concentration of the aforementioned species is from 1 atomic % to 10 atomic percent. Other concentrations that are lesser than, or greater than, the aforementioned concentration range can also be present.

In accordance with the present disclosure, the doped hydrogenated non-crystalline semiconductor material layer portion 118 contains from 5 atomic % to 40 atomic % hydrogen therein. In one embodiment, the doped hydrogenated non-crystalline semiconductor material layer portion 118 contains from 10 atomic % to 25 atomic % hydrogen therein. In yet another embodiment, the doped hydrogenated non-crystalline semiconductor material layer portion 118 contains from 20 atomic % to 30 atomic % hydrogen therein.

In some embodiments of the present disclosure, the doped hydrogenated non-crystalline semiconductor material layer portion 118 can contain C therein. When present, C can be present in a concentration from 0 atomic % to 50 atomic %. In some embodiments, the doped hydrogenated non-crystalline semiconductor material layer portion 118 can contain from 0 atomic % to 25 atomic % carbon therein. The carbon impurity can be added by way of either a source gas that includes carbon, or by introducing a carbon source gas into the gas mixture that is employed in the present disclosure for forming the doped hydrogenated non-crystalline semiconductor material layer portion 118.

The dopant that is contained within the doped hydrogenated non-crystalline semiconductor material layer portion 118 can be a p-type dopant or an n-type dopant. In a Si-containing doped hydrogenated non-crystalline semiconductor material layer portion 118 examples of p-type dopants, i.e., impurities, include but are not limited to, boron, aluminum, gallium and indium. In one embodiment, in which the doped hydrogenated non-crystalline semiconductor material layer portion 118 includes a p-type dopant, the p-type dopant is present in a concentration ranging from $10^{16}$ atoms/cm$^3$ to $10^{21}$ atoms/cm$^3$. In another embodiment, in which the doped hydrogenated non-crystalline semiconductor material layer portion 118 contains p-type dopant, the p-type dopant is present in a concentration ranging from $10^{18}$ atoms/cm³ to $5 \times 10^{20}$ atoms/cm³. In a Si-containing doped hydrogenated non-crystalline semiconductor material layer portion 118, examples of n-type dopants, i.e., impurities, include but are not limited to, antimony, arsenic and phosphorous. In one embodiment, in which the doped hydrogenated non-crystalline semiconductor material layer portion 118 contains an n-type dopant, the n-type dopant is present in a concentration ranging from $10^{16}$ atoms/cm³ to $10^{21}$ atoms/cm³. In another embodiment, in which doped hydrogenated non-crystalline semiconductor material layer portion 118 contains an n-type dopant, the n-type dopant is present in a concentration ranging from $10^{18}$ atoms/cm³ to $5 \times 10^{20}$ atoms/cm³. The dopant within the semiconductor material layer portion 118 can be uniformly present or present as a gradient.

The thickness of the doped hydrogenated non-crystalline semiconductor material layer portion 118 may range from 2 nm to 100 nm. In another embodiment, the thickness of the doped hydrogenated non-crystalline semiconductor material layer portion 118 portion 18 ranges from 5 nm to 15 nm.

In the embodiment illustrated in FIG. 2B, the gate junction 114 includes at least one other doped hydrogenated non-crystalline semiconductor material layer portion 120 located atop the doped hydrogenated non-crystalline semiconductor material layer portion 118, wherein the at least one other doped hydrogenated non-crystalline semiconductor material layer portion 120 is of the second conductivity type and is comprised of a lower band gap semiconductor material as that of the doped hydrogenated non-crystalline semiconductor material layer portion 118. In such an embodiment, the at least one other doped hydrogenated non-crystalline semiconductor material layer portion 120 includes a different semiconductor material as that described above for the doped hydrogenated non-crystalline semiconductor material layer portion 118. For example, and when the doped hydrogenated non-crystalline semiconductor material layer portion 118 comprises silicon, the at least one other doped hydrogenated non-crystalline semiconductor material layer portion 120 can comprise germanium. The hydrogen concentration and the dopant concentration in the at least one other doped hydrogenated non-crystalline semiconductor material layer portion 120 are within the ranges mentioned above for the doped hydrogenated non-crystalline semiconductor material layer portion 118. The dopant within the semiconductor material layer portion 120 can be uniformly present or present as a gradient.

In the embodiment illustrated in FIG. 2C, the doped hydrogenated non-crystalline semiconductor material layer portion 118 of the gate junction 114 is a multilayered stack comprising alternating layers of wide band gap and narrow band gap semiconductor materials. The terms "wide" and "narrow" are relative to each other. In the drawings, reference numeral 118A represents wide band gap semiconductor materials such as Si, while reference numeral 118B denote narrow band gap semiconductor materials such as Ge. The dopant within the semiconductor material layer portion 118 (including 118A and 118B) can be uniformly present or present as a gradient.

In some embodiments of the present disclosure, the doped hydrogenated crystalline semiconductor material layer portion 118 (including the wide band gap materials 118A and the narrow band gap materials 118B) may include nitrogen, oxygen, fluorine, deuterium, chlorine or any combination thereof. When present, the concentration of the aforementioned species is from 1 atomic % to 10 atomic percent. Other concentrations that are lesser than, or greater than, the aforementioned concentration range can also be present.

In some embodiments, the doped crystalline semiconductor material layer portions, the doped non-crystalline semiconductor material layer portions or both have a band gap larger than that of the crystalline semiconductor material 12. The built-in potential of the junction is improved by using a material having a larger band gap and therefore the off-current (i.e., reverse saturation current) of the junction is reduced. (Assuming interfacial defect density at the junction and the defect density in the non-crystalline material remain about the same). In some embodiments, the doped crystalline and/or non-crystalline semiconductor material layer portions are comprised of a bilayer, or a multi-layer. Also the composition of the doped crystalline and/or non-crystalline semiconductor material layer portions may be constant or vary across the layers. Examples of the doped non-crystalline layers include but not limited to a-Si:H, a-Ge:H, a-SiGe:H, a-SiC:H, a-SiO:H, a-SiN:H, nc-Si:H, nc-Ge:H, nc-SiGe:H, nc-SiC:H, nc-SiO:H, nc-SiN:H, μc-Si:H, μc-Ge:H, μc-SiGe:H, μc-SiC:H, μc-SiO:H, μc-SiN:H or combinations thereof; wherein 'a' is amorphous, 'nc' is nano-crystalline, 'μc'-micro-crystalline, and 'H' is hydrogenated. The band gap of a-Si:H is typically in the range of 1.7-1.8 eV; however, as known in the art, larger or smaller band gaps are possible by varying the deposition conditions. The band gap of a-Ge:H is typically in the range of 0.9-1.2 eV; however, similar to a-Si:H, larger and smaller band gaps are also possible. An alloy of two semiconductor materials has a band gap depending linearly on the atomic fractions of the two semiconductors, e.g., an alloy of a-Si$_x$Ge$_{1-x}$ has a band gap of $xE_{g1}+(1-x)E_{g2}$, where $E_{g1}$ is the band gap of a-Si:H, $E_{g2}$ is the band gap of a-Ge:H, x the atomic fraction of Si (number of Si atoms in the lattice divided by the total number of Si and Ge atoms), and $_{1-x}$ the atomic fraction of Ge (note that 0≤x≤1). Similarly, the band gap of an a-Si$_x$C$_{1-x}$:H alloy is increased typically from 1.7-1.8 eV to 3.6-3.7 eV as the atomic fraction of C is increased from 0 to 1. Addition of N, O or both to a-Si:H, a-Ge:H or a-SiGe:H increases the band gap, but the increase in band gap is not typically a linear function of the atomic percentage. Hydrogenated amorphous silicon-nitride (a-Si$_x$N$_{1-x}$:H) typically has a band gap of 5-5.5 eV for the stoichiometric composition x=0.42, and the band gap can be varied by changing the atomic percentage of N. Hydrogenated amorphous silicon oxide (a-SiO:H) has band gaps comparable with a-SiN:H. The band gap of semiconductor alloys or oxides/nitrides may be varied by changing the crystalline portion of the materials. The band gap of nanocrystalline or microcrystalline materials is generally lower that that of amorphous materials having the same composition. The band gap of hydrogenated nano/microcrystalline Si varies between ~1.1 eV to ~1.8 eV as the material structure varies from fully single/poly-crystalline to fully amorphous. Similarly, the band gap of hydrogenated nano/microcrystalline Ge varies between ~0.6 eV to ~1.2 eV as the material structure varies from fully single/poly-crystalline to fully amorphous. Similarly, the band gaps of hydrogenated nano/micro-crystalline SiC, SiO, SiGeO, GeO and SiN compounds are lower than that of a-SiC:H, a-SiO:H, a-SiGeO:H, a-GeO:H and a-SiN:H, respectively. (This also applies to combinations thereof). In the PECVD process, the crystalline portion of the semiconductor materials may be increased by increasing the hydrogen dilution of the source gases, increasing the plasma frequency (typically up to 120 MHz) or both. For example, hydrogenated nano-crystalline silicon oxide (nc-SiO:H) may be grown by PECVD with band gap in the range of 0.8-2.5 eV, depending on the growth conditions and oxygen content of the film.

Each of the junction field effect transistors shown in FIGS. 2A, 2B and 2C also include an electrode material portion 20 located atop the gate junction 114. Also, each junction field effect transistor shown in FIGS. 2A, 2B and 2C includes a first source/drain contact 22L located on a first side of the gate junction 114 and having a bottommost surface in contact with the surface of the crystalline semiconductor material 12, and a second source/drain contact 22R located on second side of the gate junction 114 that is opposite to the first side and having a bottommost surface in contact with the surface of the crystalline semiconductor material 12. As shown, the first source/drain contact 22L and the second source/drain contact 22R are disjoined and are not in direct physical contact with the gate junction 114. The electrode material portion 20 and the first and second source/drain contacts 22L, 22R of the second embodiment of the present disclosure comprise the same materials described above for the electrode material portion 20 and the first and second source/drain contacts 22L, 22R of the first embodiment of the present disclosure. As such, the description of elements 20, 22L, and 22R mentioned in the first embodiment of the present disclosure is incorporated herein by reference.

In some embodiments (not shown in FIGS. 2A, 2B and 2C), passivation material layer portions can be located on each side of the gate junction 114. In such an embodiment, one of the passivation material layer portions separates the first source/drain contact 22L from the first side of the gate junction 114, and another of the passivation material layer portions separates the second source/drain contact 22R from the second side of the gate junction 114. This embodiment including the various materials that can be employed as the passivation material portions will become more apparent when the various methods of the present disclosure are described and illustrated.

Figure 3:
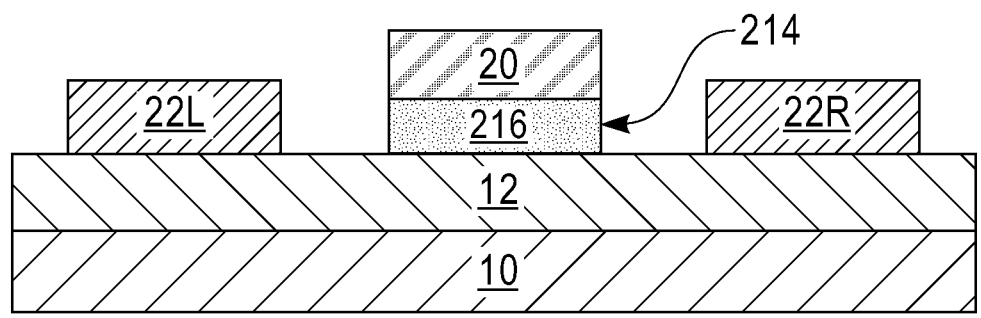
FIG. 3 is a pictorial representation (through a cross sectional view) illustrating an exemplary junction field effect transistor within a third embodiment of the present disclosure.

Referring now to FIG. 3, there is shown an exemplary junction field effect transistor within a third embodiment of the present disclosure. In the third embodiment, the gate junction 214 includes a Schottky contact that is selected from one of a metal layer portion, a metal semiconductor alloy layer portion, and a doped metal semiconductor alloy portion of the second conductivity type which is opposite from the first conductivity type of an underlying crystalline semiconductor material.

Specifically, the exemplary junction field effect transistor shown in FIG. 3 includes a crystalline semiconductor material 12 of a first conductivity type located on a surface of an insulating substrate 10. The crystalline semiconductor material 12 of the first conductivity type and the insulating substrate 10 employed in the third embodiment of the present disclosure are the same as the crystalline semiconductor material 12 of the first conductivity type and the insulating substrate 10 employed in the first embodiment of the present disclosure. As such, the description of the crystalline semiconductor material 12 of the first conductivity type and the insulating substrate 10 provided in the first embodiment of the present disclosure is incorporated herein by reference.

The junction field effect transistor shown in FIG. 3 also include an electrode material portion 20 located atop the gate junction 214. Also, the junction field effect transistor shown in FIG. 3 includes a first source/drain contact 22L located on a first side of the gate junction 214 and having a bottommost surface in contact with the surface of the crystalline semiconductor material 12, and a second source/drain contact 22R located on second side of the gate junction 214 that is opposite to the first side and having a bottommost surface in contact with the surface of the crystalline semiconductor material 12. As shown, the first source/drain contact 22L and the second source/drain contact 22R are disjoined and are not in direct physical contact with the gate junction 214. The electrode material portion 20 and the first and second source/drain contacts 22L, 22R of the third embodiment of the present disclosure comprise the same materials described above for the electrode material portion 20 and the first and second source/drain contacts 22L, 22R of the first embodiment of the present disclosure. As such, the description of elements 20, 22L, and 22R mentioned in the first embodiment of the present disclosure is incorporated herein by reference.

In the third embodiment, the gate junction 214 includes a Schottky contact 216 that is selected from one of a metal layer portion, a metal semiconductor alloy layer portion, and a doped metal semiconductor alloy portion of the second conductivity type. Schottky contact 216 can have a thickness from 1 nm to 1000 nm. Other thicknesses that are lesser than, or greater than, the aforementioned thickness range can also be employed as the thickness for the Schottky contact 216.

When the Schottky contact 216 is a metal layer portion, the metal layer portion can include any conductive metal or conductive metal alloy. Examples of conductive metals that can be used as the metal layer portion include Mo, Pt, Cr, W, Cu, Al, Pd, Ru, Ni, and Ir. Examples of conductive metal alloys include any combination of the aforementioned metals. In one embodiment of the present disclosure, the metal layer portion that is used as the Schottky contact 216 comprises a same conductive metal or metal alloy as that of the electrode material portion 20. In another embodiment of the present disclosure, the metal layer portion that is used as the Schottky contact 216 comprises a different conductive metal or metal alloy as that of the electrode material portion 20.

When the Schottky contact 216 is a metal semiconductor alloy layer portion or a doped metal semiconductor alloy portion of the second conductivity type, the metal semiconductor alloy layer portion may comprise a metal silicide or a metal germanide. Examples of metals for the metal semiconductor alloy include Ni, Pt, Ti, Pd, and Co. When the metal semiconductor alloy layer portion is doped, the dopant may be an n-type dopant or a p-type dopant. The dopant that is present in the doped metal semiconductor alloy layer portion can be present in a concentration ranging from $10^{18}$ atoms/cm$^3$ to $5 \times 10^{20}$ atoms/cm$^3$.

In some embodiments (not shown in FIG. 3), passivation material layer portions can be located on each side of the gate junction 214. In such an embodiment, one of the passivation material layer portions separates the first source/drain contact 22L from the first side of the gate junction 214, and another of the passivation material layer portions separates the second source/drain contact 22R from the second side of the gate junction 214. This embodiment including the various materials that can be employed as the passivation material portions will become more apparent when the various methods of the present disclosure are described and illustrated.

The following description describes some methods that can be employed in the present disclosure in forming the various junction field effect transistors described above. In the following description, reference is made to various materials and materials layers which have been previously described above. In such instances, the above description with respect to the specific materials and material layers can be incorporated therein by reference.

Referring now to FIGS. 4A-4G, there are illustrated the basic processing steps of a method that can be employed in forming an exemplary junction field effect transistor within the first embodiment of the present disclosure. In particular, FIGS. 4A-4G illustrate a method in which a selective epitaxial deposition method is used to form the gate junction 14.

Figure 4A:
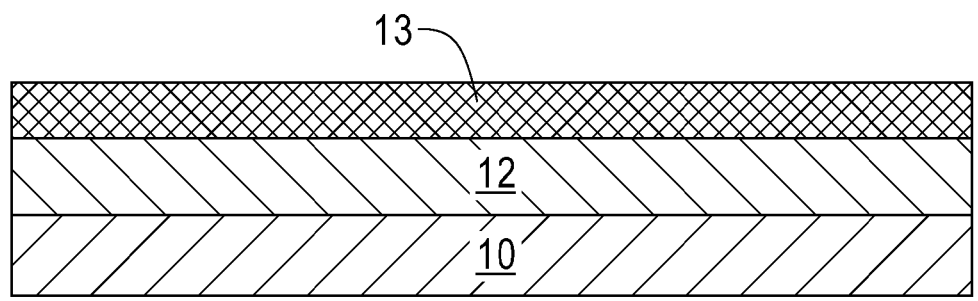
FIGS. 4A-4G are pictorial representations (through cross sectional views) illustrating the basic processing steps of one method that can be used in forming an exemplary junction field effect transistor within the first embodiment of the present disclosure.

Reference is first made to FIG. 4A which illustrates an initial structure that can be employed in the present disclosure. The initial structure illustrated in FIG. 4A includes, from bottom to top, an insulating substrate 10, a crystalline semiconductor material 12 of a first conductivity type and a blanket layer of passivation material 13 located on an exposed surface of the crystalline semiconductor material 12.

In one embodiment and as mentioned above, the crystalline semiconductor material 12 and the insulating substrate 10 may be components of a semiconductor-on-insulator substrate in which the topmost semiconductor material is the crystalline semiconductor material 12. In such an embodiment, the crystalline semiconductor material 12 can be doped to provide a first conductivity type dopant therein. The dopant may be present in the original crystalline semiconductor material or it can be introduced into an intrinsic crystalline semiconductor material utilizing ion implantation, and/or gas phase doping.

In some embodiments, the crystalline semiconductor material 12 (doped or undoped) can be grown on a surface of a transfer wafer and then that structure can be bonded to an insulating substrate 10 (or layer) of another structure. The transfer wafer can be removed after bonding providing a structure in which the crystalline semiconductor material 12 (doped or undoped) is bonded to a surface of the insulating substrate 10 (or layer). In this embodiment, doping of the crystalline semiconductor material 12 may occur in-situ during a process used in forming the crystalline semiconductor material, or following a process used in forming the crystalline semiconductor material by ion implantation, and/or gas phase doping. In such an embodiment, the crystalline semiconductor material can be formed by a deposition process such as, for example, plasma-enhanced chemical vapor deposition (CVD), or hot-wire chemical vapor deposition (HWCVD).

Next, the blanket layer of passivation material 13 is formed on the surface of the crystalline semiconductor material 12 having the first conductivity type. The passivation material serves to saturate dangling bonds on the surface of the crystalline semiconductor material 12, in order to reduce the recombination of carriers at the surface of the crystalline semiconductor material 12. The passivation material may also reduce the recombination of carriers at the surface of the crystalline semiconductor material 12 by "field-induced" passivation, for example by repelling the minority carriers from the surface of the crystalline semiconductor material 12. Field-induced passivation may be facilitated by the presence of fixed electronic charges in the passivation layer, formation of dipoles at the passivation/substrate interface, or the electric field induced by the workfunction difference between the passivation layer and the substrate semiconductor material. The passivation material may also serve to prevent air or moisture from being introduced into the crystalline semiconductor material 12. The passivation material that can be employed in the present disclosure includes, for example, a hard mask material such as, for example, a semiconductor oxide, a semiconductor nitride, a semiconductor oxynitride, or a multilayered stack thereof. The passivation material may also be comprised of a high-k dielectric (k>silicon oxide) such as aluminum oxide or hafnium oxide. In some embodiments, which is more typical to III-V materials, the passivation material may be comprised of a substantially undoped semiconductor material having a larger band gap than that of the crystalline semiconductor material 12 to passivate the surface of the crystalline semiconductor material 12 by repelling the minority carriers induced by workfunction difference between the semiconductor materials formed by the passivation material and the crystalline semiconductor material 12. In other embodiments, the passivation material can be comprised of silicon oxide, silicon nitride, and/or silicon oxynitride. The blanket layer of passivation material 13 can have a thickness from 5 nm to 50 nm. Other thicknesses that are below or above the aforementioned thickness range can also be employed.

In one embodiment, the blanket layer of passivation material 13 can be formed by a deposition process including, for example, chemical vapor deposition, plasma enhanced chemical vapor deposition, atomic layer deposition or chemical solution. In other embodiments, the blanket layer of passivation material 13 can be formed utilizing a thermal technique such as, for example, oxidation and/or nitridation. In yet other embodiments, a combination of a deposition process and a thermal technique can be used to form the blanket layer of passivation material 13. In still another embodiment, which is more typical to III-V materials, a substantially undoped semiconductor material having a larger band gap than that of the crystalline semiconductor material 12 can be used as the blanket layer of passivation material 13 and such a material can be grown on the crystalline semiconductor material 12 by conventional growth techniques such as, for example, molecular beam epitaxy or metal-organic chemical vapor deposition. The blanket layer of passivation material 13 that is formed at this stage of the present disclosure is contiguous blanket layer.

Figure 4B:
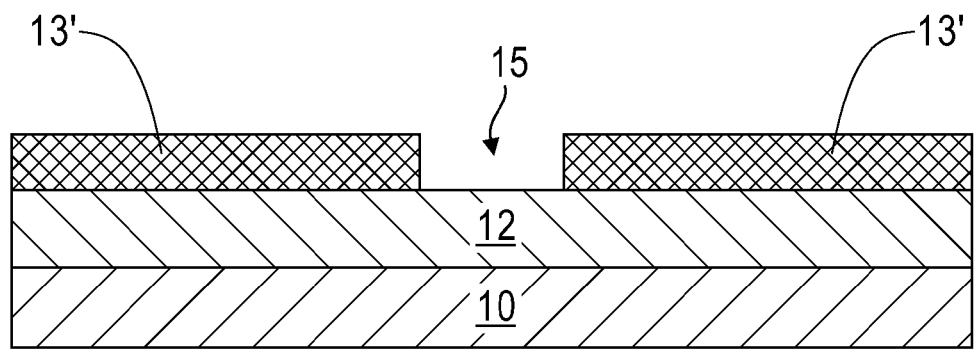

Referring now to FIG. 4B, there is illustrated the structure of FIG. 4A after forming at least one opening 15 within the blanket layer of passivation material 13 that exposes at least one portion of the surface of the crystalline semiconductor material 12. The remaining portions of the blanket layer of passivation material 13 can now be referred herein as passivation material layer portions 13'. In some embodiments, the width of each opening 15 that is formed is in the range of 10 nm to 100 nm. In other embodiments, the width of each opening 15 that is formed is in the range of 50 nm to 1 µm. In yet other embodiments, the width of each opening 15 that is formed is in the range of 500 nm to 100 µm. Contact openings narrower than 10 nm or wider than 100 µm can also be employed.

The at least one opening 15 that is formed into the blanket layer of passivation material 13 can be formed by lithography and etching. Lithography includes forming a photoresist material (not shown) on an exposed surface of the blanket layer of passivation material 13, exposing the photoresist material to a desired pattern of radiation and developing the photoresist material utilizing a conventional resist developer. The etching step, which transfers the pattern from the patterned photoresist into the blanket layer of passivation material 13, can include dry etching (i.e., reactive ion etching, ion beam etching, or plasma etching), wet chemical etching, or a combination thereof. Typically, a reactive ion etch is used to transfer the pattern from the patterned photoresist into the blanket layer of passivation material. After pattern transfer, the patterned photoresist is typically removed from the structure utilizing a conventional stripping process such as, for example, ashing.

Figure 4C:
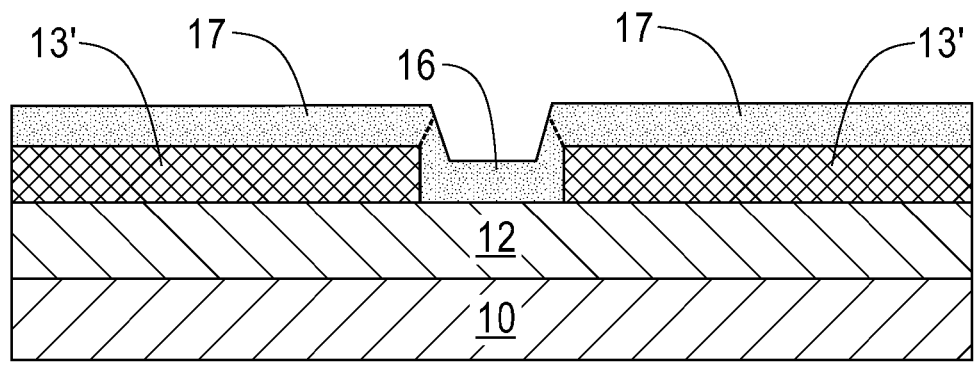

Referring now to FIG. 4C, there is illustrated the structure of FIG. 4B after epitaxially growing a doped hydrogenated semiconductor material layer of a second conductivity, wherein the second conductivity type is opposite from the first conductivity type and wherein the doped hydrogenated semiconductor material layer has a hydrogen concentration from 5 atomic % to 40 atomic %. The doped hydrogenated semiconductor material layer includes a doped hydrogenated crystalline semiconductor material layer portion 16 and doped hydrogenated non-crystalline semiconductor material layer portions 17. As shown, doped hydrogenated crystalline semiconductor material layer portion 16 is located on an exposed at least one portion of the surface of the crystalline semiconductor material 12, while the doped non-crystalline semiconductor material layer portions 17 are located on an exposed surface of the passivation material layer portions 13'.

The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. Therefore, in places in which the doped hydrogenated semiconductor material layer is grown on an exposed surface of the crystalline semiconductor material 12, a doped hydrogenated crystalline semiconductor material layer 16 is formed, while in other places in which the doped hydrogenated semiconductor material layer is grown on the passivation material layer portions 13', a doped hydrogenated non-crystalline semiconductor material layer portion 17 is formed. It is noted that each non-crystalline portion 17 of the doped hydrogenated semiconductor material layer comprises the same material and nearly the same or the same doping concentration as that of the crystalline portion 16 of the doped hydrogenated semiconductor material layer; however, the hydrogen content and/or distribution, and the doping efficiency (percentage of activated doping species) in the non-crystalline portions 17 and the crystalline portion 16 may be different.

In accordance with an embodiment of the present disclosure, the doped hydrogenated semiconductor material layer (including crystalline portion 16 and non-crystalline portions 17) is epitaxially grown at a temperature of less than 500° C. using a gas mixture that includes a source gas, hydrogen and a dopant gas. The lower temperature limit for the epitaxial growth of the doped hydrogenated semiconductor material layer is generally 100° C. In some embodiments, the doped hydrogenated semiconductor material layer can be epitaxially grown at a temperature from 150° C. to 300° C. In other embodiments, the doped hydrogenated semiconductor material layer can be epitaxially grown at a temperature from 150° C. to 250° C. The temperatures disclosed herein for the epitaxial growth is at the surface of the substrate in which the epitaxial semiconductor material layer is formed.

In one embodiment of the present disclosure, the doped hydrogenated semiconductor material layer (including crystalline portion 16 and non-crystalline portions 17) is epitaxially grown utilizing plasma enhanced chemical vapor deposition (PECVD). PECVD is a deposition process used to deposit films from a gas state (vapor) to a solid state on a deposition substrate. Chemical reactions are involved in the process, which occur after creation of a plasma of the reacting gases. A plasma is any gas in which a significant percentage of the atoms or molecules are ionized. Fractional ionization in plasmas used for deposition and related materials processing varies from about $10^{-4}$ in capacitive discharge plasmas to as high as 5-10% in high density inductive plasmas. Processing plasmas are typically operated at pressures of a few millitorr to a few torr, although arc discharges and inductive plasmas can be ignited at atmospheric pressure. In some embodiments, the plasma is created by RF (AC) frequency, such as a radio frequency induced glow charge, or DC discharge between two electrodes, the space between which is filled with the reacting gases. In one example, a PECVD device employs a parallel plate chamber configuration. In other embodiments, a hot-wire chemical vapor deposition process can be used in forming the doped hydrogenated semiconductor material layer.

In one embodiment, the source gas used to form the doped hydrogenated semiconductor material layer (including crystalline portion 16 and non-crystalline portions 17) may comprise a Si-containing precursor, such as, for example a silane and a disilane and/or a germanium-containing precursor such as, for example, a germane, $GeH_4$. In some embodiments, Si-containing and Ge-containing precursors can be used in forming the doped hydrogenated semiconductor material layer. Other gases including a carbon source such, as for example, $CH_4$ may be used.

In one embodiment and to provide epitaxial growth of a doped hydrogenated semiconductor material layer (including crystalline portion 16 and non-crystalline portions 17), a gas mixture including a ratio of hydrogen to source gas of from greater than 5:1 can be used. In another embodiment, the ratio of hydrogen to source gas that can be used ranges from 5:1 to 1000:1. For example, epitaxial growth of silicon is possible at temperatures as low as 150° C. with ratios of hydrogen to silane ($SiH_4$) ranging from 5:1 to 20:1.

The dopant gas that can be present in the epitaxial growth process provides the conductivity type, either n-type or p-type, to the doped hydrogenated semiconductor material layer (including crystalline portion 16 and non-crystalline portions 17). As stated above, the conductivity type of the doped hydrogenated semiconductor material layer is different from that of the crystalline semiconductor material 12. When a doped hydrogenated semiconductor material layer of an n-type conductivity is to be formed, the dopant gas includes at least one n-type dopant, e.g., phosphorus or arsenic. For example, when phosphorus is the n-type dopant, the dopant gas can be phosphine ($PH_3$), and when arsenic is the n-type dopant, the dopant gas can be arsine ($AsH_3$). In one example, when the conductivity type dopant is n-type, the dopant gas include phosphine gas ($PH_3$) present in a ratio to silane ($SiH_4$) ranging from 0.01% to 10%. In another example, when the conductivity type dopant is n-type, the dopant gas include phosphine gas ($PH_3$) present in a ratio to silane ($SiH_4$) ranging from 0.1% to 2%.

When a doped hydrogenated semiconductor material layer (including crystalline portion 16 and non-crystalline portions 17) of a p-type conductivity is to be formed, a dopant gas including at least one p-type dopant, e.g., B, is employed. For example, when boron is the p-type dopant, the dopant gas can be diborane ($B_2H_6$). In one embodiment, wherein the conductivity type dopant is p-type, the dopant gas may be diborane ($B_2H_6$) present in a ratio to silane ($SiH_4$) ranging from 0.01% to 10%. In another embodiment, wherein the conductivity type dopant is p-type, the dopant gas may be diborane ($B_2H_6$) present in a ratio to silane ($SiH_4$) ranging from 0.1% to 2%. In yet another embodiment, in which the conductivity type dopant is p-type, the dopant gas for may be trimethylboron (TMB) present in a ratio to silane ($SiH_4$) ranging from 0.1% to 10%.

In one embodiment of the present disclosure, the pressure for the PECVD process that can be used for epitaxially growing the doped hydrogenated semiconductor material layer (including crystalline portion 16 and non-crystalline portions 17) can range from 10 mTorr to 5 Torr, and in one example may be in the range of 250 mtorr to 900 mTorr. The power density for the PECVD process for epitaxially growing the doped hydrogenated semiconductor material layer may range from 1 $mW/cm^2$ to 100 $mW/cm^2$, and in one example may be in the range of 3 $mW/cm^2$ to 10 $mW/cm^2$. Further details regarding the epitaxial growth process for forming the doped hydrogenated semiconductor material layer of the present disclosure are described in U.S. Patent Publication No. 2012/0210932, which is owned by the assignee of the present disclosure, and is incorporated herein by reference.

In some embodiments, ammonia ($NH_3$), nitrous oxide ($N_2O$) or other gas sources may be used for nitrogen containing layers. Carbon dioxide ($CO_2$), $N_2O$ or $O_2$ may be used to provide oxygen for oxygen containing layers. A carrier gas such as hydrogen ($H_2$), deuterium ($D_2$) helium (He) or argon (Ar) may be used for any or all of the layers. The carrier gas may be pre-mixed with the gas sources or flowed simultaneously with the gas source at the time of growth.

Figure 4D:
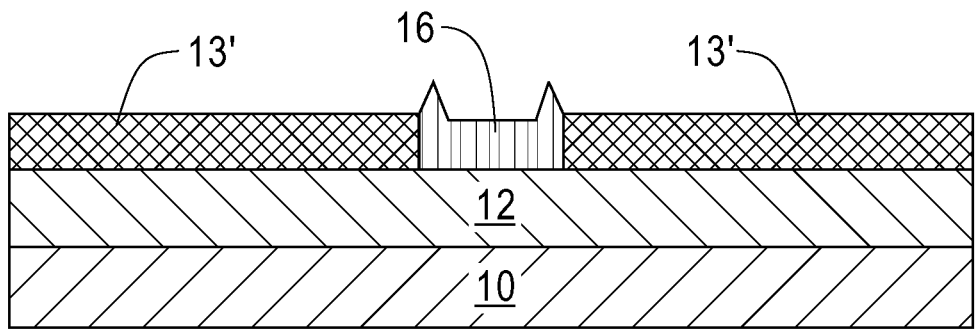

Referring now to FIG. 4D, there is illustrated the structure of FIG. 4C after removing the doped hydrogenated non-crystalline semiconductor material layer portions 17 selective to the doped hydrogenated crystalline semiconductor material layer portion 16. Each remaining doped hydrogenated crystalline semiconductor material layer portion 16 forms a gate junction of the junction field effect transistor of the present disclosure. In one embodiment, removing the doped hydrogenated non-crystalline semiconductor material layer portions 17 selective to the doped hydrogenated crystalline semiconductor material layer portion 16 includes a hydrogen plasma etch. In some embodiments, the hydrogen plasma etch that can be used to remove the doped hydrogenated non-crystalline semiconductor material layer portions 17 selective to the doped hydrogenated crystalline semiconductor material layer portion 16 can be performed in the same reactor chamber as used to form the doped hydrogenated semiconductor material layer without breaking the vacuum of the chamber; such an etch may be referred to herein as an in-situ hydrogen plasma etch. In other embodiments, the hydrogen plasma etch can be performed in a different reactor chamber as that used to form the doped hydrogenated semiconductor material layer.

The hydrogen plasma etch that can be used to remove the doped hydrogenated non-crystalline semiconductor material layer portions 17 selective to the doped hydrogenated crystalline semiconductor material layer portion 16 can be performed at a temperature of from room temperature (20° C.) to 500° C. and at a hydrogen pressure from 10 mtorr to 5 torr. In some embodiments, the hydrogen plasma etch is performed at a temperature of from 100° C. to 250° C. and at a hydrogen pressure from 10 mtorr to 1 torr. The hydrogen plasma etch can be performed utilizing one of hydrogen or HCl as a source of the hydrogen plasma. In some embodiments, the etch selectivity for removing the doped hydrogenated non-crystalline semiconductor material layer portions 17 relative to the doped hydrogenated crystalline semiconductor material layer portion 16 is from 2:1 to 10:1.

In some embodiments, the removal of the doped hydrogenated non-crystalline semiconductor material layer portions 17 relative to the doped hydrogenated crystalline semiconductor material layer portion 16 can be performed using other types of plasmas besides hydrogen plasma including, for example, $Cl_2$ or Ar.

In some embodiments (not shown), a doped hydrogenated non-crystalline semiconductor material layer of a second conductivity type can be formed atop the doped hydrogenated crystalline semiconductor material layer portion 16 at this point of the present disclosure. When present, the doped hydrogenated non-crystalline semiconductor material layer of the second conductivity type can be formed by PECVD, HWCVD or sputtering. The precursors and dopant used to form the doped hydrogenated non-crystalline semiconductor material layer can include those mentioned above in forming the doped hydrogenated crystalline semiconductor material layer. Lithography and etch can be used to remove the doped hydrogenated non-crystalline semiconductor material layer from portions of the structure, while leaving a portion of the doped hydrogenated non-crystalline semiconductor material layer atop the doped hydrogenated crystalline semiconductor material layer portion 16.

Figure 4E:
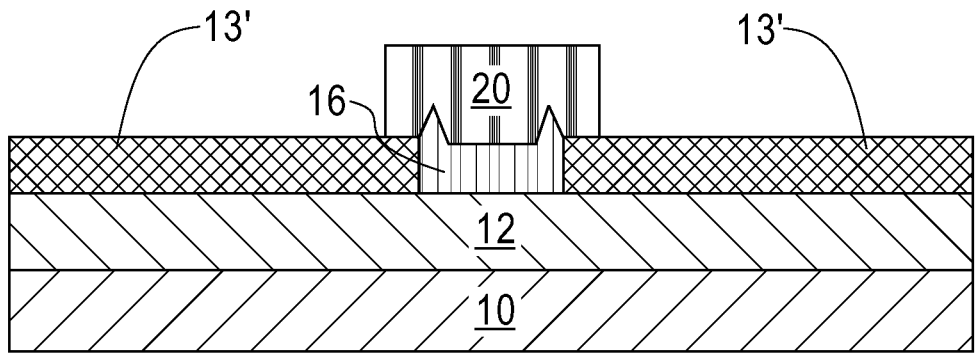

Referring now to FIG. 4E, there is illustrated the structure of FIG. 4D after forming an electrode material portion 20 on each doped hydrogenated crystalline semiconductor material layer portion 16. The electrode material portion 20 can be formed using a deposition process including, for example, chemical vapor deposition, plasma enhanced chemical vapor deposition, sputtering, chemical solution deposition, or plating. Metal silicides can be formed utilizing any conventional silicidation process that is well known to those skilled in the art. In some embodiments, the conductive material can be patterned by lithography and etching as described hereinabove.

Figure 4F:
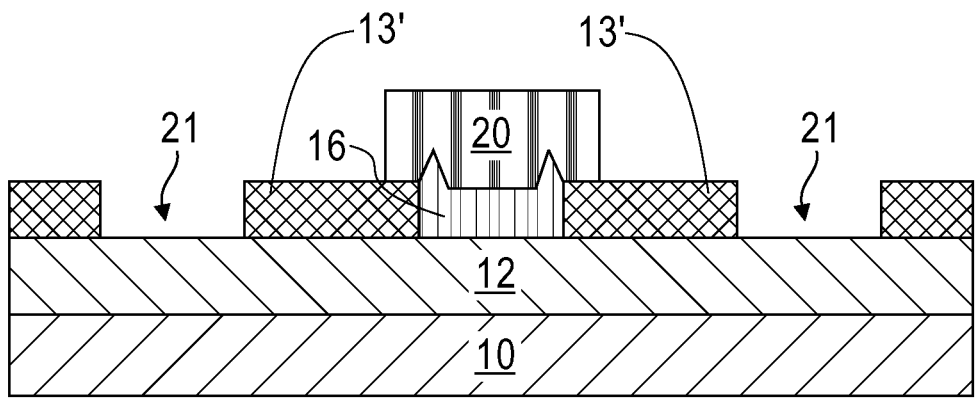

Referring now to FIG. 4F, there is illustrated the structure of FIG. 4E after forming contact openings 21 through portions of the passivation material layer portions 13' and exposing portions of the upper surface of the crystalline semiconductor material 12. The contact openings 21 can be formed by lithography and etching as described above in forming the opening within the blanket layer of passivation material 13.

Figure 4G:
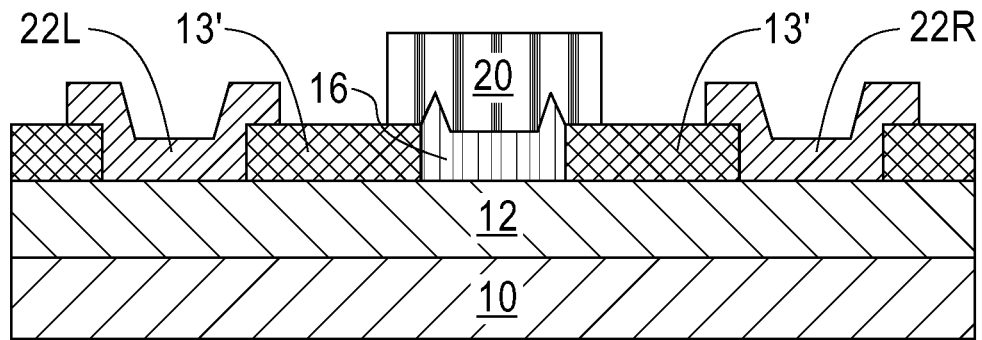

Referring now to FIG. 4G, there is illustrated the structure of FIG. 4F, after forming a first source/drain contact 22L and a second source/drain contact 22R within respective openings located on either side of the gate junction. When a metal is used as the first source/drain contact 22L and the second source/drain contact 22R, the contacts can be formed by deposition followed by an optional patterning process, i.e., lithography and etching. When the contact comprises a doped hydrogenated crystalline semiconductor material of the first conductivity type, the process step mentioned above in forming the doped hydrogenated crystalline semiconductor material layer in conjunction with forming the structure shown in FIG. 4C can be employed, followed by an etch as described above in conjunction with forming the structure shown in FIG. 4D can be performed. When the contacts are each comprised of a doped hydrogenated non-crystalline semiconductor material of the first conductivity type, PECVD, HWCVD and sputtering may be employed. The precursors and dopant can include those mentioned above in forming the doped hydrogenated semiconductor material layer.

The above processing steps can also be generally used in forming a junction transistor of the present disclosure in which the gate junction is a Schottky contact. In such an instance, and opening is formed into a blanket layer of passivation material, and then the Schottky contact material is formed using techniques that are well known to those skilled in the art. For example, a Schottky contact comprised of a conductive metal or conductive metal alloy may be formed by a deposition process such as, for example, CVD, PECVD, atomic layer deposition, sputtering, and plating. A Schottky contact comprised of a metal semiconductor alloy or a doped metal semiconductor alloy can be formed utilizing a conventional silidication or germandization process in which a metal semiconductor alloy metal such as, for example, Ti, is deposited and the heating is performed to cause reaction of the metal semiconductor alloy metal with an underlying semiconductor material. Doping of the metal semiconductor alloy can occur after formation of the metal semiconductor alloy by ion implantation and/or gas phasing doping.

Figure 5A:
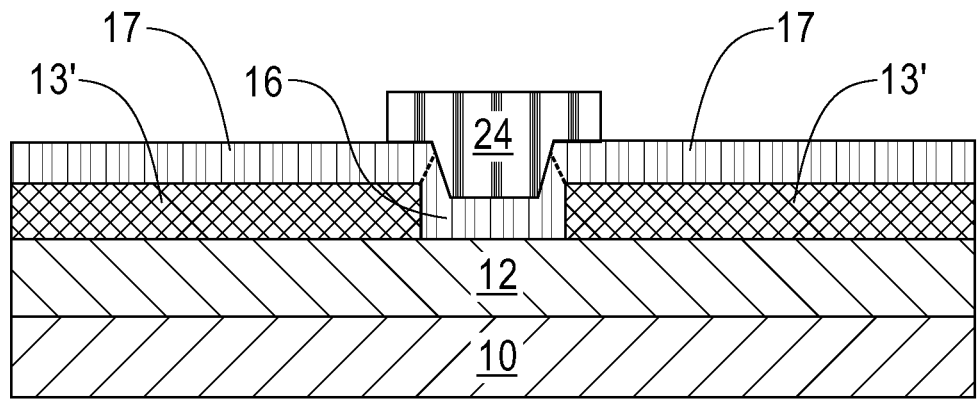
FIGS. 5A-5C are pictorial representations (through cross sectional views) illustrating the basic processing steps of another method that can be used in forming an exemplary junction field effect transistor within the first embodiment of the present disclosure.
Figure 5B:
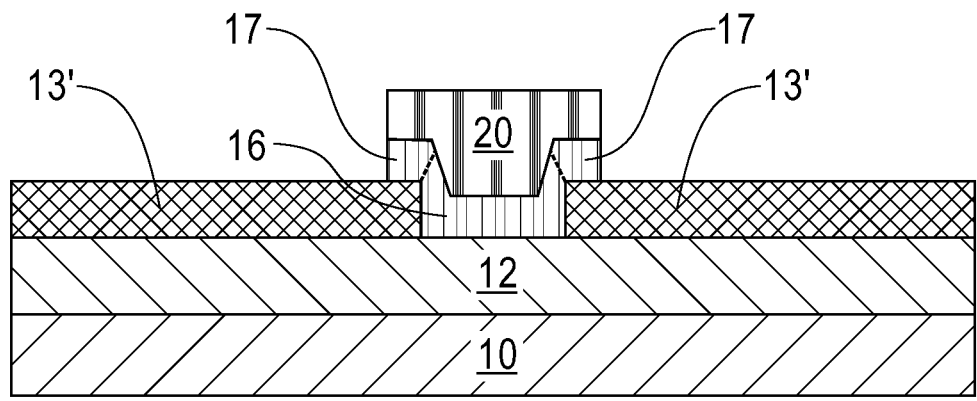
Figure 5C:
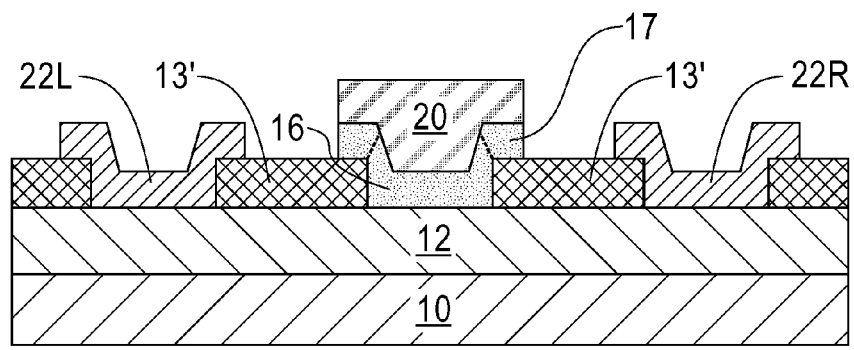

Referring now to FIGS. 5A-5C, there are illustrated the basic processing steps of another method that can be used in forming an exemplary junction field effect transistor within the first embodiment of the present disclosure. In particular, FIGS. 5A-5C illustrate a method in which a non-selective epitaxial deposition method is used to form the gate junction 14. This embodiment begins by first forming the structure shown in FIG. 4C. Next and as shown in FIG. 5A, a mask 24 can be formed on the exposed surface of the doped hydrogenated crystalline semiconductor material layer portion 16 and an adjoining end segment of the non-crystalline portions 17.

In one embodiment, the mask 24 that can be used in the non-selective method of the present disclosure may include a hard mask material that is the same or different from that of the passivation material. In another embodiment, mask 24 may be composed of one of the conductive materials mentioned above for the electrode material portion 20. The usage of a conductive material as mask 24 is advantage since the same material can be used as the electrode of the junction transistor of the present disclosure. The mask 24 can be formed by providing a blanket layer of mask material (i.e., hard mask material or conductive material) utilizing one of the techniques mentioned above for either forming the blanket layer of passivation material 13, or forming the conductive material that forms the electrode material portion 20. After forming the blanket layer of mask material, the blanket layer of mask material is patterned by lithography and etching to provide the structure shown in FIG. 5A. The etch is selective in removing exposed portions of the mask material. As shown in FIG. 5A, the adjoining end segment of each doped hydrogenated non-crystalline portion 17 which is in contact with the crystalline portion 16 of doped hydrogenated semiconductor material layer are protected by the mask 24, while remaining portions of the non-crystalline portions 17 are left exposed.

Referring now to FIG. 5B, there is illustrated the structure of FIG. 5A after removing the remaining non-crystalline portions 17 that are not protected by the mask 24 utilizing an etching step. The etch that can be used in this embodiment of the present disclosure may include for example, a dry etch process such as, for example, reactive ion etching, plasma etching or ion beam etching. Alternatively, a chemical wet etch can be employed. In one embodiment, the remaining portion of the doped hydrogenated crystalline semiconductor material layer portion 16 that is not protected by mask 24 can be removed by $SF_6$, $SF_6/O_2$ or $CCl_2F_2/O_2$ plasma.

If the mask 24 is other than a conductive material, the mask 24 can be removed by conventional techniques, such as planarization and/or grinding, and an electrode material layer portion 20 can be formed as described above. In embodiments in which mask 24 is a conductive material, the mask 24 serves as one of the electrodes of the bipolar junction transistor of this embodiment of the present disclosure.

In the non-selective method described above, the adjoining end segment of each doped hydrogenated non-crystalline semiconductor material layer portion 17 which is located beneath the electrode material portion 20 is present in the junction transistor of the present disclosure. In this embodiment of the present disclosure, no portion of electrode material portion 20 of the junction transistor produced by the non-selective method directly contacts an exposed surface of passivation layer portion 13'. Instead, an adjoining end segment of each non-crystalline portion 17 is positioned between the electrode material portion 20 and an exposed surface of the passivation material layer portion 13'. Thus, a junction transistor is provided in which the electrode material portion 20 has an outer edge that is vertically coincident with an outer edge of the adjoining end segment of each non-crystalline portion 17 and wherein an inner edge of the adjoining end segment of the non-crystalline portion 17 is in direct contact with a portion of the crystalline portion 16.

Next, the processing shown in FIGS. 4E and 4G can be performed on the structure shown in FIG. 5B to provide the first and second source/drain contacts 22L, 22R of the present disclosure. FIG. 5C shows the structure of FIG. 5B after forming the source/drain contacts 22R/22L within contact openings that are formed into the passivation material layer portions 13'.

Referring now to FIGS. 6A-6D, there are illustrated the basic processing step of one method that can be used in forming an exemplary junction field effect transistor within the second embodiment of the present disclosure. In particular, FIGS. 6A-6D illustrates a method in which the gate junction is comprised of, from bottom to top, an optional intrinsic hydrogenated non-crystalline semiconductor material layer portion 116 and a doped hydrogenated non-crystalline semiconductor material layer portion 118.

Figure 6A:
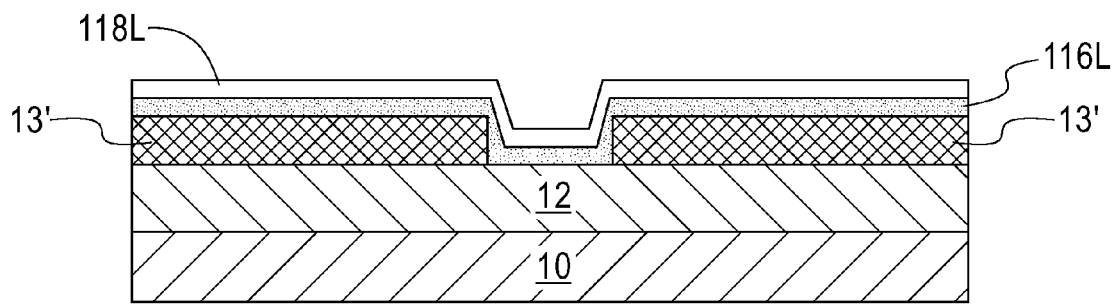
FIGS. 6A-6D are pictorial representations (through cross sectional views) illustrating the basic processing steps of one method that can be used in forming an exemplary junction field effect transistor within the second embodiment of the present disclosure.

The method of this embodiment of the present disclosure begins by first providing the structure shown in FIG. 4B. Next and as shown in FIG. 6A, a stack of an optional intrinsic hydrogenated non-crystalline semiconductor material layer 116L and a doped hydrogenated non-crystalline semiconductor material layer 118L of the second conductivity type is formed. The optional intrinsic hydrogenated non-crystalline semiconductor material layer 116L and the doped hydrogenated non-crystalline semiconductor material layer 118L of the second conductivity type can be formed by PECVD, HWCVD and/or sputtering. The precursors and, if present, dopant can include those mentioned above in forming the doped hydrogenated crystalline semiconductor material layer.

In some embodiments, additional other doped hydrogenated semiconductor material layers and/or alternating layers of a wide band gap semiconductor material and a lower band gap material can be formed by PECVD, HWCVD and/or sputtering. The precursors and dopant can include those mentioned above in forming the doped hydrogenated crystalline semiconductor material layer.

Next, mask 24 as described above in conjugation with FIG. 5A is formed atop a portion of the doped hydrogenated non-crystalline semiconductor material layer 118L of the second conductivity type that is positioned above the opening formed into the blanket layer of passivation material. The resulting structure including mask 24 is shown, for example, in FIG. 6B.

Figure 6B:
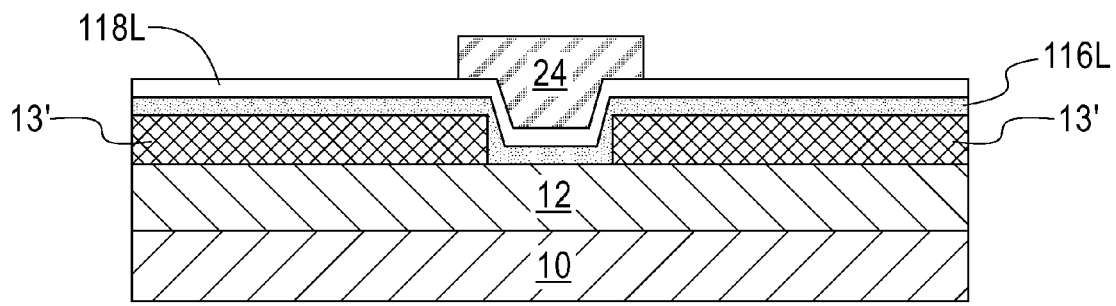
Figure 6C:
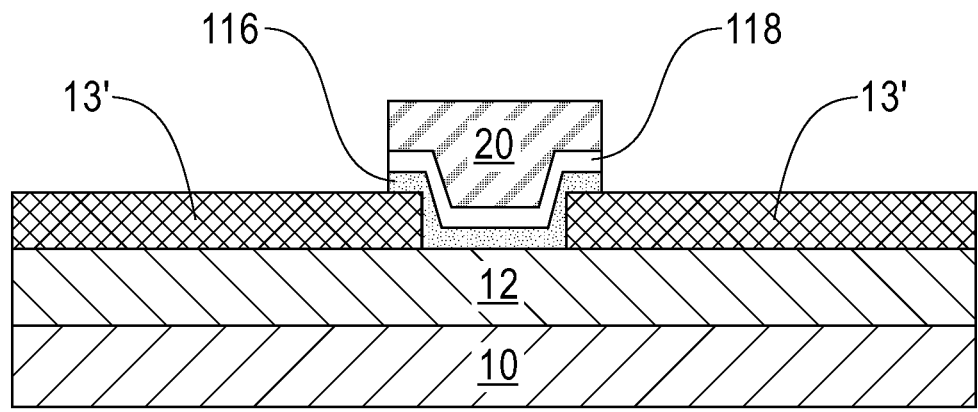

Referring now to FIG. 6C, there is illustrated the structure of FIG. 6B after etching exposed portions of the doped hydrogenated non-crystalline semiconductor material layer 118L and the optional intrinsic hydrogenated non-crystalline semiconductor material layer 116L. The etching of the exposed portions of the doped hydrogenated non-crystalline semiconductor material layer 118L and the optional intrinsic hydrogenated non-crystalline semiconductor material layer 116L may comprise a single etch or multiple etching. The etch(es) that can be used in this embodiment of the present disclosure may include for example, a dry etch process such as, for example, reactive ion etching, plasma etching or ion beam etching. Alternatively, a chemical wet etch can be employed. In one embodiment, etching in $SF_6$, $SF_6/O_2$ or $CCl_2F_2/O_2$ plasma can be used.

After etching, and if the mask 24 is other than a conductive material, the mask 24 can be removed and replaced with a conductive material forming electrode material portion 20 atop doped hydrogenated non-crystalline semiconductor material layer portion 118, and optional intrinsic hydrogenated non-crystalline semiconductor material layer portion 116. See, for example, FIG. 6C.

Figure 6D:
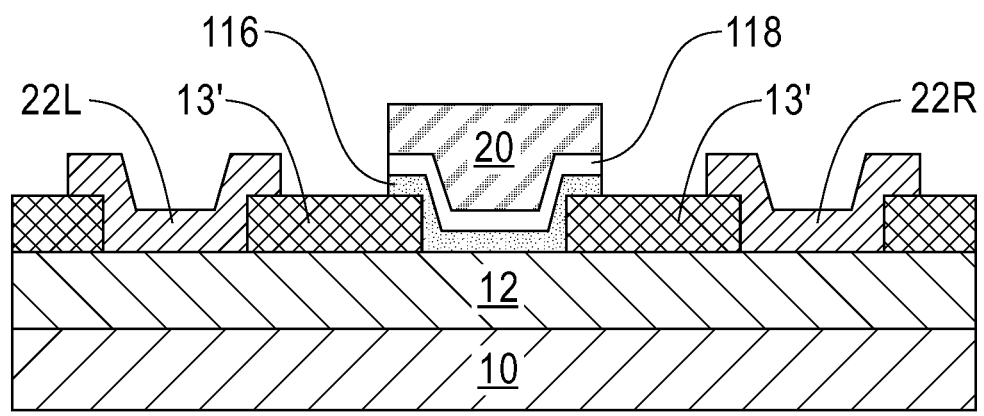

Next, the processing shown in FIGS. 4E and 4G can be performed on the structure shown in FIG. 6C to provide the first and second source/drain contacts 22L, 22R of the present disclosure. FIG. 6D shows the structure of FIG. 6C after forming the source/drain contacts 22L/22R within contact openings that are formed into the passivation material layer portions 13'.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A junction field effect transistor comprising:
    a crystalline semiconductor material of a first conductivity type located on a surface of an insulating substrate;
    a gate junction located on a surface of the crystalline semiconductor material, wherein said gate junction comprises a doped hydrogenated non-crystalline semiconductor material layer portion of a second conductivity type, wherein said second conductivity type is opposite from the first conductivity type; and
    a first source/drain contact located on a first side of the gate junction and having a bottommost surface in direct contact with a portion of said surface of said crystalline semiconductor material containing said gate junction, and a second source/drain contact located on second side of said gate junction that is opposite to said first side and having a bottommost surface in direct contact with another portion of said surface of said crystalline semiconductor material containing said gate junction, wherein no surface of said gate junction directly contacts said first source/drain contact and said second source/drain contact.

2. The junction field effect transistor of claim 1, wherein said gate junction further comprises an intrinsic hydrogenated non-crystalline semiconductor material layer portion positioned between said crystalline semiconductor material and said doped hydrogenated non-crystalline semiconductor material layer portion.

3. The junction field effect transistor of claim 1, wherein said gate junction further comprises at least one other doped hydrogenated non-crystalline semiconductor material layer portion located atop the doped hydrogenated non-crystalline semiconductor material layer portion, wherein said at least one other doped hydrogenated non-crystalline semiconductor material layer portion is of the second conductivity type and is comprised of a lower band gap semiconductor material as that of the doped hydrogenated non-crystalline semiconductor material layer portion.

4. The junction field effect transistor of claim 1, wherein said doped hydrogenated non-crystalline semiconductor material layer portion is a multilayered stack comprising alternating layers of wide-band gap and narrow band-gap semiconductor materials.

5. The junction field effect transistor of claim 1, further comprising an electrode material portion located atop said doped hydrogenated non-crystalline semiconductor material layer portion.

6. The junction field effect transistor of claim 1, wherein said first source/drain contact and said second source/drain contact are comprised of ohmic metal contacts.

7. The junction field effect transistor of claim 1, wherein said first source/drain contact and said second source/drain contact are comprised of a doped hydrogenated crystalline semiconductor material of the first conductivity type, wherein said doped hydrogenated crystalline semiconductor material has a hydrogen concentration from 5 atomic % to 40 atomic %.

8. The junction field effect transistor of claim 1, wherein said first source/drain contact and said second source/drain contact are comprised of a doped hydrogenated non-crystalline semiconductor material of the first conductivity type.

9. The junction field effect transistor of claim 1, further comprising passivation material layer portions located on each side of the gate junction, wherein one of said passivation material layer portions separates the first source/drain contact from said gate junction, and another of the passivation material layer portions separates the second source/drain contact from said gate junction.

10. A junction field effect transistor comprising:
    a crystalline semiconductor material of a first conductivity type located on a surface of an insulating substrate; and
    a gate junction located on a surface of the crystalline semiconductor material, wherein said gate junction comprises a doped hydrogenated non-crystalline semiconductor material layer portion of a second conductivity type in direct contact with a portion of said surface of said crystalline semiconductor material, wherein said second conductivity type is opposite from the first conductivity type.

11. The junction field effect transistor of claim 10, wherein said gate junction further comprises at least one other doped hydrogenated non-crystalline semiconductor material layer portion located atop the doped hydrogenated non-crystalline semiconductor material layer portion, wherein said at least one other doped hydrogenated non-crystalline semiconductor material layer portion is of the second conductivity type and is comprised of a lower band gap semiconductor material as that of the doped hydrogenated non-crystalline semiconductor material layer portion.

12. The junction field effect transistor of claim 10 wherein said doped hydrogenated non-crystalline semiconductor material layer portion is a multilayered stack comprising alternating layers of wide-band gap and narrow band-gap semiconductor materials.

13. The junction field effect transistor of claim 10, further comprising an electrode material portion located atop said doped hydrogenated non-crystalline semiconductor material layer portion.

14. The junction field effect transistor of claim 10, further comprising a first source/drain contact located on a first side of the gate junction and having a bottommost surface in contact with the surface of the crystalline semiconductor material, and a second source/drain contact located on second side of the gate junction that is opposite to said first side and having a bottommost surface in contact with the surface of the crystalline semiconductor material, wherein said first source/drain contact and said second source/drain contact are disjoined from said gate junction.

15. The junction field effect transistor of claim 10, wherein said first source/drain contact and said second source/drain contact are comprised of ohmic metal contacts.

16. The junction field effect transistor of claim 10, wherein said first source/drain contact and said second source/drain contact are comprised of a doped hydrogenated crystalline semiconductor material of the first conductivity type, wherein said doped hydrogenated crystalline semiconductor material has a hydrogen concentration from 5 atomic % to 40 atomic %.

17. The junction field effect transistor of claim 10, wherein said first source/drain contact and said second source/drain contact are comprised of a doped hydrogenated non-crystalline semiconductor material of the first conductivity type.

18. The junction field effect transistor of claim 10, further comprising passivation material layer portions located on each side of the gate junction, wherein one of said passivation material layer portions separates the first source/drain contact from said gate junction, and another of the passivation material layer portions separates the second source/drain contact from said gate junction.

* * * * *